US008835579B2

(12) United States Patent
Lamatsch et al.

(10) Patent No.: US 8,835,579 B2
(45) Date of Patent: Sep. 16, 2014

(54) PROCESS FOR POLYMERISING (HETERO)AROMATIC COMPOUNDS

(75) Inventors: Bernd Lamatsch, Riehen (CH); Achim Lamatsch, legal representative, Waldkirch (DE); Pascal Hayoz, Hofstetten (CH); Mathias Dueggeli, Thuernen (CH); Martin Elbs, Basel (CH); Olivier Frederic Aebischer, Duedingen (CH)

(73) Assignee: BASF SE, Ludwigshafen (DE)

( * ) Notice: Subject to any disclaimer, the term of this patent is extended or adjusted under 35 U.S.C. 154(b) by 274 days.

(21) Appl. No.: 13/321,889

(22) PCT Filed: May 18, 2010

(86) PCT No.: PCT/EP2010/056776
§ 371 (c)(1),
(2), (4) Date: Jan. 23, 2012

(87) PCT Pub. No.: WO2010/136352
PCT Pub. Date: Dec. 2, 2010

(65) Prior Publication Data
US 2012/0142872 A1 Jun. 7, 2012

(30) Foreign Application Priority Data

May 27, 2009 (EP) .................................... 09161243
Nov. 19, 2009 (EP) .................................... 09176497

(51) Int. Cl.
C08F 4/80 (2006.01)
C08F 4/48 (2006.01)
C08F 4/60 (2006.01)

(52) U.S. Cl.
USPC ........ 526/169.1; 526/172; 526/161; 526/169; 526/239; 526/256; 526/257; 526/258; 526/259

(58) Field of Classification Search
USPC .............. 526/169.1, 169, 172, 161, 139, 256, 526/258
See application file for complete search history.

(56) References Cited

U.S. PATENT DOCUMENTS

| 5,777,070 | A | 7/1998 | Inbasekaran et al. | |
|---|---|---|---|---|
| 6,451,459 | B1 * | 9/2002 | Tieke et al. | 428/690 |
| 6,956,095 | B2 | 10/2005 | Treacher et al. | |
| 7,332,107 | B2 * | 2/2008 | Takei et al. | 252/500 |
| 7,589,081 | B2 * | 9/2009 | Zapf et al. | 514/89 |
| 8,058,387 | B2 * | 11/2011 | Chan et al. | 528/377 |
| 8,501,902 | B2 * | 8/2013 | Tierney et al. | 528/394 |
| 2004/0116713 | A1 * | 6/2004 | Beller et al. | 548/412 |
| 2007/0045592 | A1 * | 3/2007 | Tierney et al. | 252/500 |
| 2007/0123707 | A1 | 5/2007 | Zapf et al. | |
| 2007/0228359 | A1 | 10/2007 | Heim et al. | |
| 2009/0065766 | A1 | 3/2009 | Li | |
| 2009/0065878 | A1 | 3/2009 | Li | |
| 2009/0302311 | A1 | 12/2009 | Turbiez et al. | |
| 2012/0142872 | A1 * | 6/2012 | Lamatsch et al. | 526/93 |

FOREIGN PATENT DOCUMENTS

| EP | 1 078 970 | 2/2001 | |
|---|---|---|---|
| EP | 1 754 736 | 2/2007 | |
| EP | 1 997 844 | 12/2008 | |
| EP | 2 033 983 | 3/2009 | |
| EP | 2 034 537 | 3/2009 | |
| JP | 2010-144162 A * | 7/2010 | ............ C08G 61/12 |
| WO | 2004 101581 | 11/2004 | |
| WO | WO 2004/101581 A2 * | 11/2004 | ............ C07F 9/547 |
| WO | 2005 049695 | 6/2005 | |
| WO | 2008 000664 | 1/2008 | |
| WO | 2009 047104 | 4/2009 | |
| WO | 2010 049321 | 5/2010 | |
| WO | 2010 049323 | 5/2010 | |
| WO | 2010 108873 | 9/2010 | |
| WO | 2010 115767 | 10/2010 | |
| WO | WO 2010/136352 A1 * | 12/2010 | ............ C08G 73/06 |

OTHER PUBLICATIONS

Schulz et al. Angew. Chem. Int. Ed. 2009, 48, 918-921.*
Dumrath et al. Angew. Chem. Int. Ed. 2010,49,8988-8992.*
Harkal et al. Adv. Synth. Catal. 2004, 346, 1742-1748.*
Wawrzyniak, P.; Heinicke, J. Tetrahedron Letts. 2006, 8921-8924.*
International Search Report Issued Aug. 25, 2010 in PCT/EP10/056776 Filed May 18, 2010.
U.S. Appl. No. 13/246,003, filed Sep. 27, 2011, Wuerthner, et al.

* cited by examiner

Primary Examiner — Rip A. Lee
(74) Attorney, Agent, or Firm — Oblon, Spivak, McClelland, Maier & Neustadt, L.L.P.

(57) ABSTRACT

The present invention relates to a process for polymerizing (hetero)aromatic compounds under formation of aryl-aryl C—C couplings for preparing conjugated polymers with high molecular weight and high regioregularity, and to novel polymers obtainable by this process. The invention further relates to the use of the novel polymers as semiconductors or charge transport materials in optical, electrooptical or electronic devices including field effect transistors (FETs), thin film transistors (TFT), electroluminescent, photovoltaic and sensor devices.

16 Claims, No Drawings

PROCESS FOR POLYMERISING (HETERO)AROMATIC COMPOUNDS

The present invention relates to a process for polymerising (hetero)aromatic compounds under formation of aryl-aryl C—C couplings for preparing conjugated polymers with high molecular weight and high regioregularity, and to novel polymers obtainable by this process. The invention further relates to the use of the novel polymers as semiconductors or charge transport materials in optical, electrooptical or electronic devices including field effect transistors (FETs), thin film transistors (TFT), electroluminescent, photovoltaic and sensor devices.

WO2004101581 describes nitrogen-containing monodentate phosphane ligands of formula

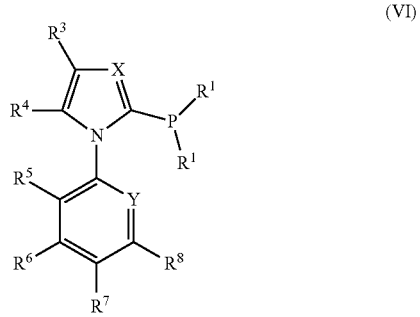

(VI)

and to their use in catalytic reactions. The phosphane ligands have proved suitable especially as the ligand component for the catalytic preparation of arylated olefins (Heck reactions), biaryls (Suzuki reactions), a-aryl ketones and amines from aryl halides or vinyl halides.

U.S. Pat. No. 5,777,070 is directed to a process for preparing a conjugated polymer which comprises contacting (i) monomers having two reactive groups selected from boronic acid, $C_1$-$C_6$boronic acid ester, $C_1$-$C_6$borane, and combinations thereof, with aromatic dihalide-functional monomers or (ii) monomers having one reactive boronic acid, boronic acid ester, or borane group and one reactive halide-functional group, with each other; wherein the monomers are selected so that the polymerization reaction products of such have conjugated unsaturated internal groups;

in a reaction mixture which contains:
(a) an organic solvent in which the polymer forms at least a 1 percent solution;
(b) an aqueous solution of an inorganic base having a pKa in the range of from 9 to 13, said solution having a concentration of at least 0.1N;
(c) a catalytic amount of a palladium complex; and
(d) at least 0.01 mole percent of a phase transfer catalyst, based on the number of moles of boronic acid, boric acid ester, and borane groups in the reaction mixture;
under reaction conditions sufficient to form the corresponding conjugated polymer.

U.S. Pat. No. 6,956,095 discloses a process for the reaction of a halogen- or sulphonyloxy-functional aryl or heteroaryl compound with an aromatic or heteroaromatic boron compound in the presence of a catalytic amount of a palladium compound, a base and a multi-phase solvent mixture wherein an aryl-aryl or aryl-heteroaryl or heteroaryl-heteroaryl C—C bond is formed, characterised in that the solvent mixture comprises at least 0.1% by volume of a compound from each of the following groups i) water-miscible organic solvents
ii) water-immiscible organic solvents
iii) water,
with the proviso that both alcohols and carbonyl compounds which contain a-hydrogen atoms are excluded; b. and the palladium compound does not contain triphenylphosphine or the latter is not specifically added to the reaction mixture.

EP1754736A1 relates to a process for polymerising a heteroaromatic compound under formation of aryl-aryl C—C couplings, wherein said compound has at least one functional halide group and at least one functional boron group, or copolymerising at least one first and at least one second heteroaromatic compound under formation of aryl-aryl C—C couplings, wherein said first compound has at least two functional halide groups and said second compound has at least two functional boron groups, wherein the polymerisation is carried out in presence of a) a catalyst/ligand system comprising a palladium catalyst and an organic phosphine or phosphonium compound, b) a base, c) a solvent or a mixture of solvents, characterized in that the functional halide and boron groups are attached to a thiophene or selenophene ring that is optionally substituted and optionally fused to another ring, and the organic phosphine or phosphonium compound is a trisubstituted phosphine or phosphonium salt with substituents selected from optionally substituted alkyl and aryl groups.

The catalyst systems used in Examples 1 to 10 of EP1754736A1 are shown in the table below.

| Example | Catalyst | Phosphine | Base | Solvent |
|---|---|---|---|---|
| 1 | Pd$_2$(dba)$_3$ | (t-Bu)$_3$PHBF$_4$ | K$_2$CO$_3$ | THF |
| 2 | " | " | " | " |
| 3 | " | " | " | THF/Toluol |
| 4 | " | " | " | THF |
| 5 | " | " | " | " |
| 6 | " | " | " | " |
| 7 | " | 1) | " | " |
| 8 | " | 1) | " | " |
| 9 | " | (t-Bu)$_3$PHBF$_4$ | " | THF |
| 10 | " | (t-Bu)$_3$PHBF$_4$ | " | THF |

1) 2-Dicyclohexylphosphino-2',6'-dimethoxybiphenyl.

The manufacturing method of the conjugated polymer according JP2007023252 comprises causing (A) an aromatic monomer bearing at least two boron-containing functional groups to polymerize with an aromatic monomer bearing at least two reactive functional groups or (B) an aromatic monomer bearing at least one reactive functional group and at least one boron-containing functional group in the same molecule to polymerize, in the presence of an organic solvent using a catalytic amount of a palladium complex, where at least one selected from the group consisting of alkali metal hydroxides, alkali metal alkoxides, alkaline earth metal hydroxides and alkali earth metal alkoxides, and an alkylphosphine ligand is used.

EP1997844 relates to a method for production of a conjugated polymer comprising contacting (A) an aromatic monomer having at least two boron-containing functional groups with an aromatic monomer having at least two reactive functional groups or (B) aromatic monomers having at least one boron-containing functional group and at least one reactive functional group with each other, both in an ether solvent in the presence of a palladium catalyst wherein a phosphine compound is coordinated to palladium, cesium carbonate and 1 to 100 moles of water per 1 mole of the boron-containing functional group of the above-mentioned aromatic monomer.

The object underlying the present invention is to provide a polymerisation process, which is suitable for large-scale applications, is readily accessible and convert starting materials to the respective polymers in high yield, with high purity and high selectivity.

Said object has been solved by a process for polymerising a (hetero)aromatic compound under formation of aryl-aryl C—C couplings, wherein said compound has at least one functional halide group and at least one functional boron group, or copolymerising at least one first and at least one second (hetero)aromatic compound under formation of aryl-aryl C—C couplings, wherein said first compound has at least two functional halide groups and said second compound has at least two functional boron groups, wherein the polymerisation is carried out in presence of a) a catalyst/ligand system comprising a palladium catalyst and an organic phosphine or phosphonium compound,
b) a base,
c) a solvent or a mixture of solvents, characterized in that the organic phosphine is a trisubstituted phosphine of formula

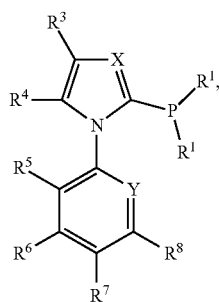

(VI)

or phosphonium salt thereof, wherein X independently of Y represents a nitrogen atom or a C—R$^2$ group and Y independently of X represents a nitrogen atom or a C—R$^9$ group, R$^1$ for each of the two R$^1$ groups independently of the other represents a radical selected from the group $C_1$-$C_{24}$-alkyl, $C_3$-$C_{20}$-cycloalkyl, which includes especially both monocyclic and also bi- and tri-cyclic cycloalkyl radicals, $C_5$-$C_{14}$-aryl, which includes especially the phenyl, naphthyl, fluorenyl radical, $C_2$-$C_{13}$-heteroaryl, wherein the number of hetero atoms, selected from the group N, O, S, may be from 1 to 2, wherein the two radicals R$^1$ may also be linked to one another, and wherein the above-mentioned radicals R$^1$ may themselves each be mono- or poly-substituted independently of one another by substituents selected from the group hydrogen, $C_1$-$C_{20}$-alkyl, $C_2$-$C_{20}$-alkenyl, $C_3$-$C_8$-cycloalkyl, $C_2$-$C_9$-hetero-alkyl, $C_2$-$C_9$-heteroaryl, wherein the number of hetero atoms from the group N, O, S may be from 1 to 4, $C_1$-$C_{20}$-alkoxy, hydroxy, amino of the forms NH—($C_1$-$C_{20}$-alkyl), NH—($C_5$-$C_{10}$-aryl), N($C_1$-$C_{20}$-alkyl)$_2$, N($C_1$-$C_{20}$-alkyl)($C_5$-$C_{10}$-aryl), N($C_5$-$C_{10}$-aryl)$_2$, N($C_1$-$C_{20}$-alkyl/$C_5$-$C_{10}$-aryl$_3$)$_3^+$, NH—CO—$C_1$-$C_{20}$-alkyl, NH—CO—$C_5$-$C_{10}$-aryl, carboxylato of the forms COOH and COOQ (wherein Q represents either a monovalent cation or $C_1$-$C_8$-alkyl), $C_1$-$C_6$-acyloxy, sulfinato, sulfonato of the forms $SO_3H$ and $SO_3Q'$ (wherein Q' represents either a monovalent cation, $C_1$-$C_{20}$-alkyl, or $C_5$-$C_{10}$-aryl), tri-$C_1$-$C_6$-alkylsilyl, wherein two of the mentioned substituents may also be bridged with one another, R$^2$-R$^9$ represent a hydrogen, alkyl, alkenyl, cycloalkyl, aromatic or heteroaromatic aryl, O-alkyl, NH-alkyl, N-(alkyl)$_2$, O-(aryl), NH-(aryl), N-(alkyl)(aryl), O—CO-alkyl, O—CO-aryl, F, Si(alkyl)$_3$, CF$_3$, CN, CO$_2$H, COH, SO$_3$H, CONH$_2$, CONH(alkyl), CON(alkyl)$_2$, SO$_2$(alkyl), SO(alkyl), SO(aryl), SO$_2$(aryl), SO$_3$(alkyl), SO$_3$(aryl), S-alkyl, S-aryl, NH—CO(alkyl), CO$_2$(alkyl), CONH$_2$, CO(alkyl), NHCOH, NHCO$_2$(alkyl), CO(aryl), CO$_2$(aryl) radical, wherein two or more adjacent radicals, each independently of the other (s), may also be linked to one another so that a condensed ring system is present and wherein in R$^2$ to R$^9$ alkyl represents a hydrocarbon radical having from 1 to 20 carbon atoms which may in each case be linear or branched, alkenyl represents a mono- or poly-unsaturated hydrocarbon radical having from 2 to 20 carbon atoms which may in each case be linear or branched, cycloalkyl represents a hydrocarbon having from 3 to 20 carbon atoms, aryl represents a 5- to 14-membered aromatic radical, wherein from one to four carbon atoms in the aryl radical may also be replaced by hetero atoms from the group nitrogen, oxygen and sulfur so that a 5- to 14-membered heteroaromatic radical is present, wherein the radicals R$^2$ to R$^9$ may also carry further substituents as defined for R$^1$.

The present invention further relates to novel conjugated polymers and copolymers obtainable or obtained by a process as described above and below.

The present invention further relates to a semiconductor or charge transport material, component or device comprising one or more polymers as described above and below.

The invention further relates to the use of a material, polymer, component or device according to the present invention as charge-transport, semiconducting, electrically conducting, photoconducting or light-emitting material in optical, electrooptical, electronic semiconducting or electroluminescent (EL) components or devices, organic field effect transistors (OFET), integrated circuits (IC), thin film transistors (TFT), flat panel displays, radio frequency identification (RFID) tags, electroluminescent or photoluminescent devices or components, organic light emitting diodes (OLED), backlights of displays, photovoltaic or sensor devices, charge injection layers, Schottky diodes, planarising layers, antistatic films, conducting substrates or patterns, electrode materials in batteries, photoconductors, electrophotographic applications, electrophotographic recording, organic memory devices, alignment layers, cosmetic or pharmaceutical compositions, biosensors, biochips, security markings, polymerisable liquid crystal materials, liquid crystal polymers, anisotropic polymer films with charge transport properties or methods or devices for detecting and discriminating DNA sequences.

The present invention further relates to an optical, electrooptical or electronic device, OFET, IC, TFT, TFT array for flat panel displays, RFID tag, OLED, EL display, backlight or alignment layer comprising a material, polymer, component or device according to the present invention.

The term "functional group" refers to a group which is capable of a Suzuki coupling reaction with another group to produce an aryl-aryl C—C bond. The functional groups are selected from a first type A which is, for example, a halide group, and a second type B which is, for example, a boron group. Difunctional compounds can comprise the same or different types of functional groups and are accordingly referred to as "AA-, BB-, AB-type compounds".

The term "functional halide group" means a group preferably selected from halogen or a sulfonyloxy group. Very preferred halide groups are Cl, Br, I or a sulfonyloxy group of the formula —OSO$_2$R$^{100}$, wherein R$^{100}$ is optionally fluorinated alkyl or aryl, preferably having 1 to 12 C atoms, such as, for example methyl, trifluoromethyl, or 4-methylphenyl, so that the sulfonyloxy group is accordingly mesylate, triflate or tosylate. Especially preferred are Br, or I.

The term "functional boron group" means a boronic acid, boronic acid ester (boronate), or borane group. The boron group is preferably of the formula —B(OR$^{101}$)(OR$^{102}$), wherein R$^{101}$ and R$^{102}$ are independently of each other H or alkyl with 1 to 12 C-atoms, or R$^{101}$ and R$^{102}$ together form an optionally substituted cyclic aliphatic or aromatic group, especially an alkylene or arylene group having 2 to 20 C atoms. The borane group is preferably of the formula —B(OH)$_2$, —B(OH)$_3$—, —BF$_3$—, —B(OY$^1$)$_2$,

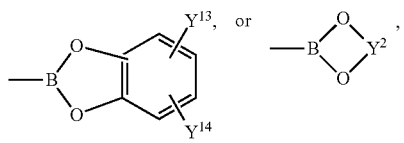

wherein Y$^1$ is independently in each occurrence a C$_1$-C$_{10}$alkyl group and Y$^2$ is independently in each occurrence a C$_2$-C$_{10}$alkylene group, such as —CY$^3$Y$^4$—CY$^5$Y$^6$—, or —CY$^7$Y$^8$—CY$^9$Y$^{10}$—CY$^{11}$Y$^{12}$—, wherein Y$^3$, Y$^4$, Y$^5$, Y$^6$, Y$^7$, Y$^8$, Y$^9$, Y$^{10}$, Y$^{11}$ and Y$^{12}$ are independently of each other hydrogen, or a C$_1$-C$_{10}$alkyl group, especially —C(CH$_3$)$_2$C(CH$_3$)$_2$—, or —C(CH$_3$)$_2$CH$_2$C(CH$_3$)$_2$—, —CH$_2$C(CH$_3$)$_2$CH$_2$—, and Y$^{13}$ and Y$^{14}$ are independently of each other hydrogen, or a C$_1$-C$_{10}$alkyl group. Very preferred are the following groups:

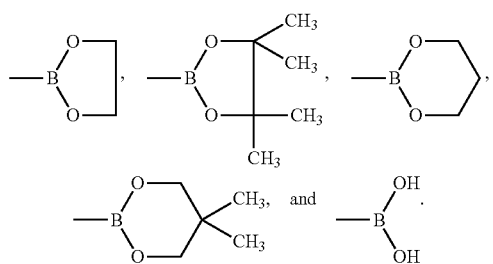

The catalyst/ligand system comprises a palladium catalyst and an organic trisubstituted phosphine or phosphonium salt.

The palladium catalyst is preferably a Pd(0) or Pd(II) compound or metallic Pd. Suitable and preferred Pd compounds are for example Pd(II) salts or organic Pd(0) compounds or complexes. Very preferred are Pd(II) halides, Pd(II) carboxylates and Pd(II) diketonates. Examples of preferred catalysts include the following compounds:

palladium(II) acetylacetonate, palladium(0) dibenzylideneacetone complexes, palladium(II) propionate, Pd$_2$(dba)$_3$: [tris(dibenzylideneacetone) dipalladium(0)], Pd(dba)$_2$: [bis(dibenzylideneacetone) palladium(0)], Pd(PR$_3$)$_2$, wherein PR$_3$ is a trisubstituted phosphine of formula VI, Pd(OAc)$_2$: [palladium(II) acetate], palladium(II) chloride, palladium(II) bromide, lithium tetra-chloropalladate(II), PdCl$_2$(PR$_3$)$_2$; wherein PR$_3$ is a trisubstituted phosphine of formula VI; palladium(0) diallyl ether complexes, palladium(II) nitrate, PdCl$_2$(PhCN)$_2$: [dichlorobis(benzonitrile) palladium(II)], PdCl$_2$(CH$_3$CN): [dichlorobis(acetonitrile) palladium(II)], and PdCl$_2$(COD): [dichloro(1,5-cyclooctadiene) palladium(II)].

Especially preferred are PdCl$_2$, Pd$_2$(dba)$_3$, Pd(dba)$_2$, Pd(OAc)$_2$, or Pd(PR$_3$)$_2$. Most preferred are Pd$_2$(dba)$_3$ and Pd(OAc)$_2$.

The phosphine ligand is formed in situ from the corresponding phosphonium salt during the process by the addition of base. Alternatively, the phosphine ligand is directly employed in the process.

The organic phosphine is a trisubstituted phosphine, wherein at least one substituent is an optionally substituted heterocyclic ring; especially an optionally substituted heteroaromatic ring. More preferred, the organic phosphine is a trisubstituted phosphine, wherein at least one substituent is an optionally substituted 5-membered heterocyclic ring; especially an optionally substituted 5-membered heteroaromatic ring.

Advantageously, the organic phosphine is a trisubstituted phosphine of formula

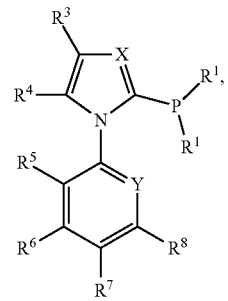

(VI)

or phosphonium salt thereof, wherein X independently of Y represents a nitrogen atom or a C—R$^2$ group and Y independently of X represents a nitrogen atom or a C—R$^9$ group, R$^1$ for each of the two R$^1$ groups independently of the other represents a radical selected from the group C$_1$-C$_{24}$-alkyl, C$_3$-C$_{20}$-cycloalkyl, which includes especially both monocyclic and also bi- and tri-cyclic cycloalkyl radicals, C$_5$-C$_{14}$-aryl, which includes especially the phenyl, naphthyl, fluorenyl radical, C$_2$-C$_{13}$-heteroaryl, wherein the number of hetero atoms, selected from the group N, O, S, may be from 1 to 2, wherein the two radicals R$^1$ may also be linked to one another, and wherein the above-mentioned radicals R$^1$ may themselves each be mono- or poly-substituted independently of one another by substituents selected from the group hydrogen, C$_1$-C$_{20}$-alkyl, C$_2$-C$_{20}$-alkenyl, C$_3$-C$_8$-cycloalkyl, C$_2$-C$_9$-hetero-alkyl, C$_2$-C$_9$-heteroaryl, wherein the number of hetero atoms from the group N, O, S may be from 1 to 4, C$_1$-C$_{20}$-alkoxy, C$_1$-C$_{10}$-hydroxy, amino of the forms NH—(C$_1$-C$_{20}$-alkyl), NH—(C$_5$-C$_{10}$-aryl), N(C$_1$-C$_{20}$-alkyl)$_2$, N(C$_1$-C$_{20}$-alkyl) (C$_5$-C$_{10}$-aryl), N(C$_5$-C$_{10}$-aryl)$_2$, N(C$_1$-C$_{20}$-alkyl/C$_5$-C$_{10}$-aryl)$_3$)$^+$, NH—CO—C$_1$-C$_{20}$-alkyl, NH—CO—C$_5$-C$_{10}$-aryl, carboxylato of the forms COOH and COOQ (wherein Q represents either a monovalent cation or C$_1$-C$_8$-alkyl), C$_1$-C$_6$-acyloxy, sulfinato, sulfonato of the forms SO$_3$H and SO$_3$Q' (wherein Q' represents either a monovalent cation, C$_1$-C$_{20}$-alkyl, or C$_5$-C$_{10}$-aryl), tri-C$_1$-C$_6$-alkylsilyl, wherein two of the mentioned substituents may also be bridged with one another, R$^2$-R$^9$ represent a hydrogen, alkyl, alkenyl, cycloalkyl, aromatic or heteroaromatic aryl, O-alkyl, NH-alkyl, N-(alkyl)$_2$, O-(aryl), NH-(aryl), N-(alkyl)(aryl), O—CO-alkyl, O—CO-aryl, F, Si(alkyl)$_3$, CF$_3$, CN, CO$_2$H, COH, SO$_3$H, CONH$_2$, CONH(alkyl), CON(alkyl)$_2$, SO$_2$(alkyl), SO(alkyl), SO(aryl), SO$_2$(aryl), SO$_3$(alkyl), SO$_3$(aryl), S-alkyl, S-aryl, NH—CO(alkyl), CO$_2$(alkyl), CONH$_2$, CO(alkyl), NHCOH, NHCO$_2$(alkyl), CO(aryl), CO$_2$(aryl) radical, wherein two or more adjacent radicals, each independently of the other (s), may also be linked to one another so that a condensed ring system is present and wherein in $R^2$ to $R^9$ alkyl represents a hydrocarbon radical having from 1 to 20 carbon atoms which may in each case be linear or branched, alkenyl represents a mono- or polyunsaturated hydrocarbon radical having from 2 to 20 carbon atoms which may in each case be linear or branched, cycloalkyl represents a hydrocarbon having from 3 to 20 carbon atoms, aryl represents a 5- to 14-membered aromatic radical, wherein from one to four carbon atoms in the aryl radical may also be replaced by hetero atoms from the group nitrogen, oxygen and sulfur so that a 5- to 14-membered heteroaromatic radical is present, wherein the radicals $R^2$ to $R^9$ may also carry further substituents as defined for $R^1$. $R^1$ may be a group of formula

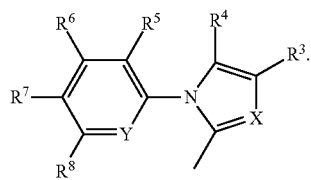

The mentioned alkyl radicals have preferably from 1 to 10 carbon atoms, particularly preferably from 1 to 5. The alkenyl radicals have preferably from 2 to 10 carbon atoms, particularly preferably from 2 to 5. The cycloalkyl radicals have preferably from 3 to 8 carbon atoms. The aryl radicals have preferably from 6 to 10 carbon atoms, the heteroaryl radicals from 4 to 9.

Preference is given to ligands wherein X is $CR^2$ and Y is $CR^9$, yielding compounds of formula

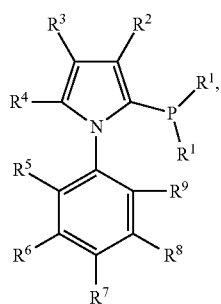

(VIa)

wherein the radicals $R^1$ to $R^9$ are as defined above.

In a further preferred embodiment, X is nitrogen and Y is a $CR^9$ group:

(VIb)

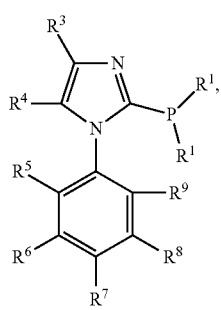

wherein the radicals $R^1$ to $R^9$ are as defined above.

Preferred ligands of formula VI carry at least one radical $R^1$ is selected from the group consisting of phenyl, $C_1$-$C_{10}$alkyl, cyclopentyl, cyclohexyl, cycloheptyl, 1-adamantyl, 2-adamantyl, 5H-dibenzophospholyl, 9-phospha-bicyclo[3.3.1]nonanyl, 9-phosphabicyclo[4.2.1]nonanyl radicals. Examples of preferred $C_1$-$C_{10}$-alkyl radicals are methyl, ethyl, n-propyl, 1-methylethyl, n-butyl, 1-methylpropyl, 1,1-dimethylethyl, n-pentyl, 1-methylbutyl, 2-methylbutyl, 3-methylbutyl, 2,2-dimethylpropyl, 1-ethyl-propyl, n-hexyl, 1,1-dimethylpropyl, 1,2-dimethylpropyl, 1-methylpentyl, 2-methylpentyl, 3-methylpentyl, 4-methyl-pentyl, 1,1-dimethylbutyl, 1,2-dimethylbutyl, 1,3-dimethylbutyl, 2,2-dimethylbutyl, 2,3-dimethylbutyl, 3,3-dimethyl-butyl, 1-ethylbutyl, 2-ethylbutyl, 1,1,2-trimethylpropyl, 1,2,2-trimethylpropyl, 1-ethyl-1-methylpropyl, n-heptyl, n-octyl, n-nonyl, n-decyl, particular preference being given especially to the isopropyl radical and the tert.-butyl radical.

Preferred radicals $R^2$ to $R^9$ are selected from the group consisting of hydrogen, $C_1$-$C_{10}$-alkyl, $C_2$-$C_{10}$-alkenyl, $C_1$-$C_{10}$-haloalkyl, $C_3$-$C_8$-cycloalkyl, $C_6$-$C_{10}$-aryl, which includes especially also phenyl, naphthyl, fluorenyl, and $C_2$-$C_6$-heteroaryl, wherein from 1 to 3 nitrogen atoms or an oxygen or sulfur atom may be present as hetero atom, and wherein two adjacent radicals $R^2$ to $R^9$ may be bridged with one another, there preferably being formed a 4- to 8-membered, preferably aromatic ring.

Preferably, X represents a $CR^2$ group and Y represents a $CR^9$ group, or X is nitrogen and Y represents a $CR^9$ group.

$R^1$ is preferably selected from the group consisting of phenyl, $C_1$-$C_{10}$-alkyl, cyclopentyl, cyclohexyl, cycloheptyl, 1-adamantyl, 2-adamantyl, 5H-dibenzo-phospholyl, 9-phosphabicyclo[3.3.1]nonanyl, and 9-phosphabicyclo[4.2.1]nonanyl radicals.

$R^2$ to $R^9$ are selected from the group hydrogen, $C_1$-$C_{10}$-alkyl, $C_2$-$C_{10}$-alkenyl, $C_1$-$C_{10}$-haloalkyl, $C_3$-$C_8$-cycloalkyl, $C_6$-$C_{10}$-aryl, $C_2$-$C_6$-heteroaryl, wherein from 1 to 3 nitrogen atoms or an oxygen or sulfur atom may be present as hetero atom and wherein two adjacent radicals $R^2$ to $R^9$ may be bridged with one another.

Preferred organic phosphines are selected from trisubstituted phosphines of formula

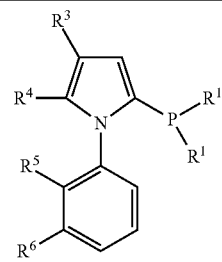

| Cpd. | $R^1$ | $R^5$ | $R^6$ | $R^3$ | $R^4$ |
|---|---|---|---|---|---|
| A-1 | $H_3C$-C($CH_3$)($CH_3$) | H | H | H | H |
| A-2 | cyclohexyl | H | H | H | H |
| A-3 | phenyl | H | H | H | H |
| A-4 | adamantyl | H | H | H | H |
| A-5 | cyclohexyl | —$OCH_3$ | H | H | H |
| A-6 | cyclohexyl | 1) | 1) | H | H |

-continued

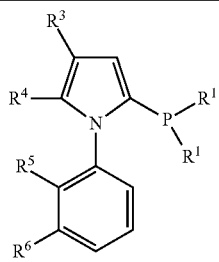

| Cpd. | R¹ | R⁵ | R⁶ | R³ | R⁴ |
|------|----|----|----|----|----|
| A-7 | H₃C-C(CH₃)₂-CH₃ (tert-butyl) | 1) | 1) | H | H |
| A-8 | phenyl | 1) | 1) | H | H |
| A-9 | adamantyl | 1) | 1) | H | H |
| A-10 | cyclohexyl | H | H | 2) | 2) |
| A-11 | H₃C-C(CH₃)₂-CH₃ (tert-butyl) | H | H | 2) | 2) |
| A-12 | phenyl | H | H | 2) | 2) |
| A-13 | adamantyl | H | H | 2) | 2) |

1) R⁵ and R⁶ together form a ring 

2) R³ and R⁴ together form a ring 

The organic phosphines and their synthesis are described in WO2004101581.

The palladium catalyst is present in the reaction mixture in catalytic amounts. The term "catalytic amount" refers to an amount that is clearly below one equivalent of the (hetero) aromatic compound(s), preferably 0.001 to 5 mol-%, most preferably 0.001 to 1 mol-%, based on the equivalents of the (hetero)aromatic compound(s) used.

The amount of phosphines or phosphonium salts in the reaction mixture is preferably from 0.001 to 10 mol-%, most preferably 0.01 to 5 mol-%, based on the equivalents of the (hetero)aromatic compound(s) used. The preferred ratio of Pd:phosphine is 1:4.

The base can be selected from all aqueous and nonaqueous bases and can be inorganic, or organic. It is preferable that at least 1.5 equivalents of said base per functional boron group is present in the reaction mixture. Suitable bases are, for example, alkali and alkaline earth metal hydroxides, carboxylates, carbonates, fluorides and phosphates such as sodium and potassium hydroxide, acetate, carbonate, fluoride and phosphate or also metal alcoholates. It is also possible to use a mixture of bases. The base is preferably a lithium salt, such as, for example, lithium alkoxides (such as, for example, lithium methoxide and lithium ethoxide), lithium hydroxide, carboxylate, carbonate, fluoride and/or phosphate.

The at present most preferred base is aqueous LiOHxH₂O (monohydrate of LiOH) and (waterfree) LiOH.

The reaction is typically conducted at about 0° C. to 180° C., preferably from 20 to 160° C., more preferably from 40 to 140° C. and most preferably from 40 to 120° C. A polymerization reaction may take 0.1, especially 0.2 to 100 hours.

In a preferred embodiment of the present invention the solvent is THF, the base is LiOH*H₂O and the reaction is conducted at reflux temperature of THF (about 65° C.).

Control of molecular weight is, for example, possible by using either an excess of dibromide, diboronic acid, or diboronate, or a chain terminator, such as, for example, a monofunctional monomer of formula Ia to Iy (=monomer of formula I), IIa to IIy (=monomer of formula II), IIIa to IIIz, IIIa' to IIId' (=monomer of formula III) and IVa to IVz, Iva' to IVd' (=monomer of formula IV).

The solvent is for example selected from toluene, xylenes, anisole, THF, 2-methyltetrahydrofuran, dioxane, chlorobenzene, fluorobenzene or solvent mixtures comprising one or more solvents like e.g. THF/toluene and optionally water. Most preferred is THF, or THF/water.

Advantageously, the polymerisation is carried out in presence of a) palladium(II) acetate, or Pd₂(dba)₃, (tris(dibenzylideneacetone)dipalladium(0)) and an organic phosphine A-1 to A-13, b) LiOH, or LiOHxH₂O; and c) THF, and optionally water. If the monohydrate of LiOH is used, no water needs to be added.

Most preferred the polymerisation is carried out in presence of a) palladium(II) acetate, or Pd₂(dba)₃ (tris(dibenzylideneacetone)dipalladium(0)) and

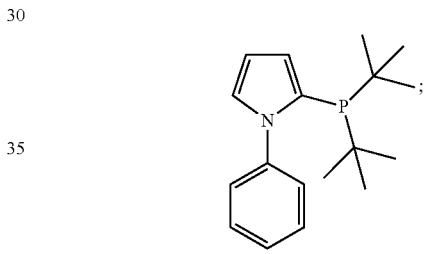

b) LiOHxH₂O; and c) THF. The palladium catalyst is present in an amount of preferably about 0.5 mol-%, based on the equivalents of the (hetero)aromatic compound(s) used. The amount of phosphines or phosphonium salts in the reaction mixture is preferably about 2 mol-%, based on the equivalents of the (hetero) aromatic compound(s) used. The preferred ratio of Pd:phosphine is about 1:4.

Preferably the polymerization reaction is conducted under inert conditions in the absence of oxygen. Nitrogen and more preferably argon are used as inert gases.

In principle, the monomers can be added in any sequence. For example, the monomers, which form the polymer, can be added together with the catalyst and ligand followed by the base to start the reaction, or one monomer can be introduced with the catalyst, ligand and the base, followed by controlled addition of the second monomer. Other addition sequences are known to the person skilled in the art.

(Hetero)aromatic compounds are preferred, wherein the functional halide and boron groups of the (heteroaromatic) compounds are attached to a 5-membered heteroaromatic ring that is optionally substituted and optionally fused to another ring.

(Hetero)aromatic compounds are more preferred, wherein the functional halide and boron groups are attached to a thiophene, furane, pyrrole, or phenyl ring, especially thiophene, or furane ring, very especially a thiophene ring.

Examples of (hetero)aromatic compounds are compounds derived from a diketopyrrolopyrrole skeleton. Such compounds as well as polymers derived therefrom are, for example, described in U.S. Pat. No. 6,451,459B1, WO05/049695, WO08/000664, WO09/047104, PCT/EP2009/063767, PCT/EP2009/063769, PCT/EP2010/053655, PCT/EP2010/054152 and European patent application no. 09161243.2, and can be represented by formula

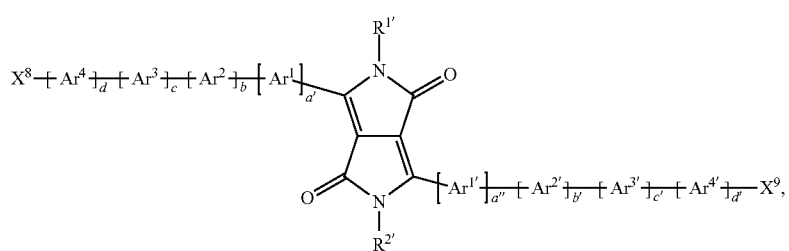

(I)

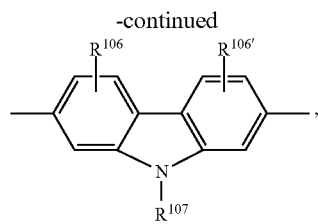

-continued

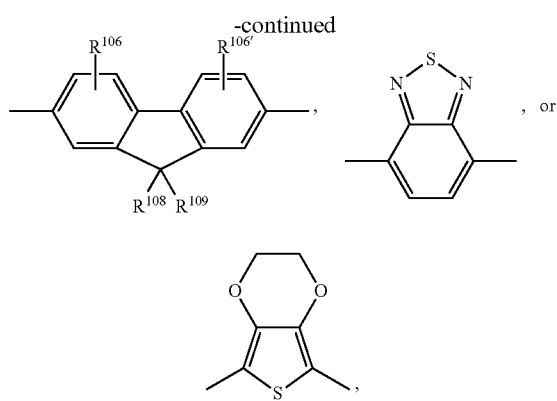

wherein a' is 1, 2, or 3, a" is 0, 1, 2, or 3; b is 0, 1, 2, or 3; b' is 0, 1, 2, or 3; c is 0, 1, 2, or 3; c' is 0, 1, 2, or 3; d is 0, 1, 2, or 3; d' is 0, 1, 2, or 3; with the proviso that b' is not 0, if a" is 0;

$R^{1'}$ and $R^{2'}$ may be the same or different and are selected from hydrogen, a $C_1$-$C_{100}$alkyl group, —COOR$^{106}$, a $C_1$-$C_{100}$alkyl group which is substituted by one or more halogen atoms, hydroxyl groups, nitro groups, —CN, or $C_6$-$C_{18}$aryl groups and/or interrupted by —O—, —COO—, —OCO—, or —S—; a $C_7$-$C_{100}$arylalkyl group, a carbamoyl group, $C_5$-$C_{12}$cycloalkyl, which can be substituted one to three times with $C_1$-$C_8$alkyl and/or $C_1$-$C_8$alkoxy, a $C_6$-$C_{24}$aryl group, in particular phenyl or 1- or 2-naphthyl which can be substituted one to three times with $C_1$-$C_8$alkyl, $C_1$-$C_{24}$thioalkoxy, and/or $C_1$-$C_{24}$alkoxy, or pentafluorophenyl, $R^{106}$ is $C_1$-$C_{50}$alkyl, especially $C_4$-$C_{25}$alkyl;

$Ar^1$, $Ar^{1'}$, $Ar^2$, $Ar^{2'}$, $Ar^3$, $Ar^{3'}$, $Ar^4$ and $Ar^{4'}$ are independently of each other heteroaromatic, or aromatic rings, which optionally can be condensed and/or substituted, especially

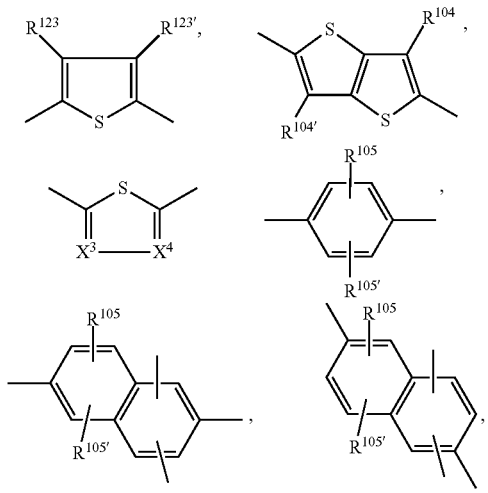

wherein one of $X^3$ and $X^4$ is N and the other is $CR^{99}$, $R^{99}$, $R^{104}$, $R^{104'}$, $R^{123}$ and $R^{123'}$ are independently of each other hydrogen, halogen, especially F, or a $C_1$-$C_{25}$alkyl group, especially a $C_4$-$C_{25}$alkyl, which may optionally be interrupted by one or more oxygen or sulphur atoms, $C_7$-$C_{25}$arylalkyl, or a $C_1$-$C_{25}$alkoxy group, $R^{105}$, $R^{105'}$, $R^{106}$ and $R^{106'}$ are independently of each other hydrogen, halogen, $C_1$-$C_{25}$alkyl, which may optionally be interrupted by one or more oxygen or sulphur atoms;

$C_7$-$C_{25}$arylalkyl, or $C_1$-$C_{18}$alkoxy, $R^{107}$ is $C_7$-$C_{25}$arylalkyl, $C_6$-$C_{18}$aryl; $C_6$-$C_{18}$aryl which is substituted by $C_1$-$C_{18}$alkyl, $C_1$-$C_{18}$perfluoroalkyl, or $C_1$-$C_{18}$alkoxy; $C_1$-$C_{18}$alkyl; $C_1$-$C_{18}$alkyl which is interrupted by —O—, or —S—; or —COOR$^{124}$;

$R^{124}$ is $C_1$-$C_{25}$alkyl group, especially a $C_4$-$C_{25}$alkyl, which may optionally be interrupted by one or more oxygen or sulphur atoms, $C_7$-$C_{25}$arylalkyl, $R^{108}$ and $R^{109}$ are independently of each other H, $C_1$-$C_{25}$alkyl, $C_1$-$C_{25}$alkyl which is substituted by E and/or interrupted by D, $C_7$-$C_{25}$arylalkyl, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, or $C_7$-$C_{25}$aralkyl, or $R^{108}$ and $R^{109}$ together form a group of formula $=CR^{110}R^{111}$, wherein $R^{110}$ and $R^{111}$ are independently of each other H, $C_1$-$C_8$alkyl, $C_1$-$C_{18}$alkyl which is substituted by E and/or interrupted by D, $C_6$-$C_{24}$aryl, $C_6$-$C_{24}$aryl which is substituted by G, or $C_2$-$C_{20}$heteroaryl, or $C_2$-$C_{20}$heteroaryl which is substituted by G, or $R^{108}$ and $R^{109}$ together form a five or six membered ring, which optionally can be substituted by $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, or $C_7$-$C_{25}$aralkyl, D is —CO—, —COO—, —S—, —O—, or —$NR^{112}$—, E is $C_1$-$C_8$thioalkoxy, $C_1$-$C_8$alkoxy, CN, —$NR^{112}R^{113}$, —$CONR^{112}R^{113}$, or halogen, G is E, or $C_1$-$C_{18}$alkyl, and $R^{112}$ and $R^{113}$ are independently of each other H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—, and $X^8$ and $X^9$ are independently of each other a halogen atom, very especially I, or Br; or —$OS(O)_2CF_3$, —$OS(O)_2$-aryl, especially

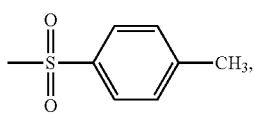

—$OS(O)_2CH_3$, —$B(OH)_2$, —$B(OH)_3$—, —$B(F)_3$—, —$B(OY^1)_2$,

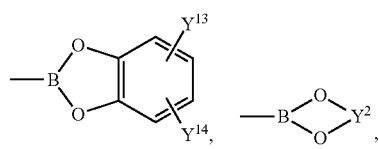

—$BF_4Na$, or —$BF_4K$, wherein $Y^1$ is independently in each occurrence a $C_1$-$C_{10}$alkyl group and $Y^2$ is independently in each occurrence a $C_2$-$C_{10}$alkylene group, such as —$CY^3Y^4$—$CY^5Y^6$—, or —$CY^7Y^8$—$CY^9Y^{10}$—$CY^{11}Y^{12}$—, wherein $Y^3$, $Y^4$, $Y^5$, $Y^6$, $Y^7$, $Y^8$, $Y^9$, $Y^{10}$, $Y^{11}$ and $Y^{12}$ are independently of each other hydrogen, or a $C_1$-$C_{10}$alkyl group, especially —$C(CH_3)_2C(CH_3)_2$—, —$C(CH_3)_2CH_2C(CH_3)_2$—, or —$CH_2C(CH_3)_2CH_2$—, and $Y^{13}$ and $Y^{14}$ are independently of each other hydrogen, or a $C_1$-$C_{10}$alkyl group.

$Ar^1$, $Ar^{1'}$, $Ar^2$, $Ar^{2'}$, $Ar^3$, $Ar^{3'}$, $Ar^4$ and $Ar^{4'}$ are preferably

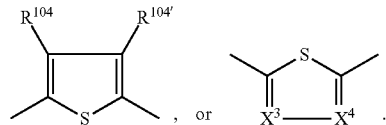

$R^{1'}$ and $R^{2'}$ can be different, but are preferably the same. Preferably, $R^{1'}$ and $R^{2'}$ independently from each other stand for $C_1$-$C_{100}$alkyl, $C_5$-$C_{12}$cycloalkyl, which can be substituted one to three times with $C_1$-$C_8$alkyl and/or $C_1$-$C_8$alkoxy, phenyl or 1- or 2-naphthyl which can be substituted one to three times with $C_1$-$C_8$alkyl and/or $C_1$-$C_8$alkoxy, or —$CR^{201}R^{202}$—$(CH_2)_m$-$A_3$, wherein $R^{201}$ and $R^{202}$ stand for hydrogen, or $C_1$-$C_4$alkyl, $A^3$ stands for phenyl or 1- or 2-naphthyl, which can be substituted one to three times with $C_1$-$C_8$alkyl and/or $C_1$-$C_8$alkoxy, and m stands for 0 or 1. $R^{1'}$ and $R^{2'}$ are more preferably a $C_1$-$C_{36}$ alkyl group, especially a $C_{12}$-$C_{24}$alkyl group, such as n-dodecyl, tridecyl, tetradecyl, pentadecyl, hexadecyl, 2-ethyl-hexyl, 2-butyl-hexyl, 2-butyl-octyl, 2-hexyldecyl, 2-decyl-tetradecyl, heptadecyl, octadecyl, eicosyl, heneicosyl, docosyl, or tetracosyl. In a particularly preferred embodiment of the present invention $R^{1'}$ and $R^{2'}$ are a 2-hexyldecyl, or 2-decyl-tetradecyl group.

Advantageously, the groups $R^{1'}$ and $R^{2'}$ can be represented by formula

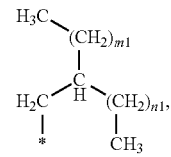

wherein $m1=n1+2$ and $m1+n1 \leq 24$. Chiral side chains, such as $R^{1'}$ and $R^{2'}$, can either be homochiral, or racemic, which can influence the morphology of the polymers.

In said embodiment preferred "AA- and BB-type compounds" are compounds of formula Ia to Iy and IIa to IIy, respectively. Reference is made to claim 10. More preferred "AA- and BB-type compounds" are compounds of formula Ia, Ii, Iq, and Is, and IIa, IIi, IIq, and IIs, respectively. Most preferred are compounds of formula IIa and IIi.

Additional examples of (hetero)aromatic compounds are, for example, described in U.S. Pat. No. 6,451,459B1, WO05/049695, EP1754736, WO08/000664, WO09/047104, PCT/EP2009/063767, PCT/EP2009/063769, PCT/EP2010/053655, PCT/EP2010/054152 and European patent application no. 09161243.2, and can, for example, be represented by formula

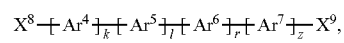

wherein k is 1, or 2, l is 0, or 1, r is 0, or 1, z is 0, or 1, and $Ar^4$, $Ar^5$, $Ar^6$ and $Ar^7$ are independently of each other a group of formula

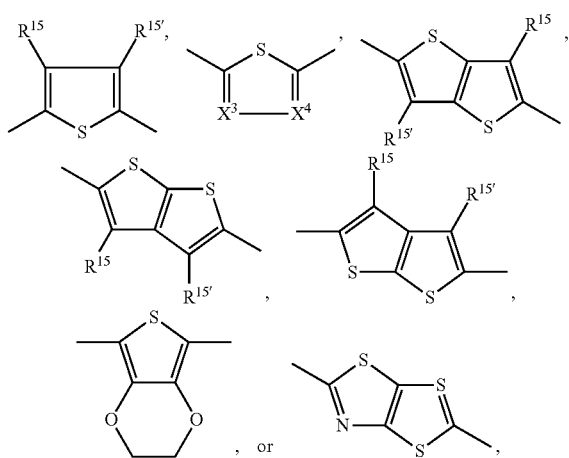

wherein
- $R^{15}$ and $R^{15'}$ are independently of each other H, or a $C_1$-$C_{25}$alkyl group, especially a $C_6$-$C_{25}$alkyl, which may optionally be interrupted by one or more oxygen atoms, and $R^{14}$ is a $C_1$-$C_{25}$alkyl group, especially a $C_6$-$C_{25}$alkyl, which may optionally be interrupted by one or more oxygen atoms, and one of
- $X^3$ and $X^4$ is N and the other is $CR^{99}$, $X^8$ and $X^9$ are as defined above;
- $R^{99}$ is hydrogen, halogen, especially F, or a $C_1$-$C_{25}$alkyl group, especially a $C_4$-$C_{25}$alkyl, which may optionally be interrupted by one or more oxygen or sulphur atoms, $C_7$-$C_{25}$arylalkyl, or a $C_1$-$C_{25}$alkoxy group. Additional examples are compounds IIIo to IIIz, IIIa' to IIId' and IVo to IVz, Iva' to IVd'. Reference is made to claim 11.

In said embodiment preferred "AA- and BB-type compounds" are compounds of formula IIIa to IIIz, IIIa' to IIId' and IVa to IVz, Iva' to IVd', respectively. Reference is made to claim 11. More preferred "AA- and BB-type compounds" are compounds of formula IIIa, IIIc, IIIf, IIIo, IIIp, IIIq and IIIz and IVa, IVc, IVf, IVo, IVp, IVq and IVz, respectively. Most preferred are compounds of formula IVa, IVc, IVf, IVo, IVp, IVq and IVz.

"AB-type compounds" can be derived from "AA-type compounds" by replacing one $X^{11}$ group by a $X^{11'}$ group. Examples of such compounds are

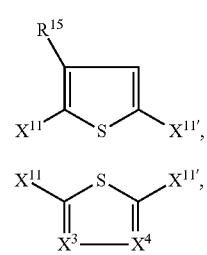

(Va)

(Vb)

(Vc)

and

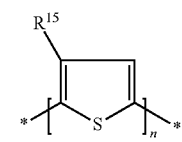

(Vd)

wherein $R^{15}$, $R^{15'}$, $X^{11}$, $X^{11'}$, $X^3$ and $X^4$ are as defined above.

Polymerization of "AB-type compounds" can result in homopolymers:

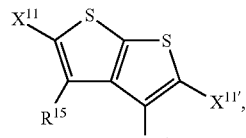

Homopolymers can be obtained by reacting "AA-type and BB-type compounds" which are only distinguished in the groups $X^{11}$ and $X^{11'}$:

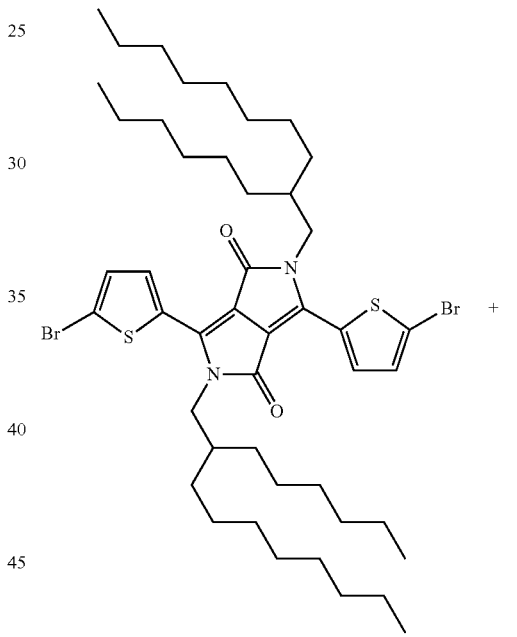

+

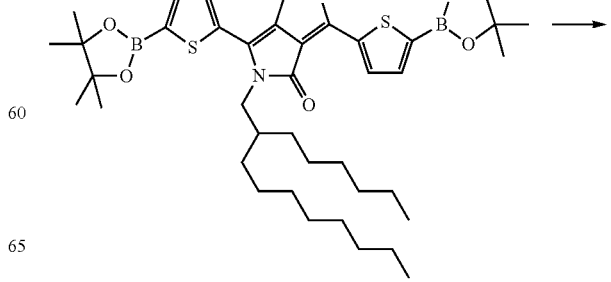

→

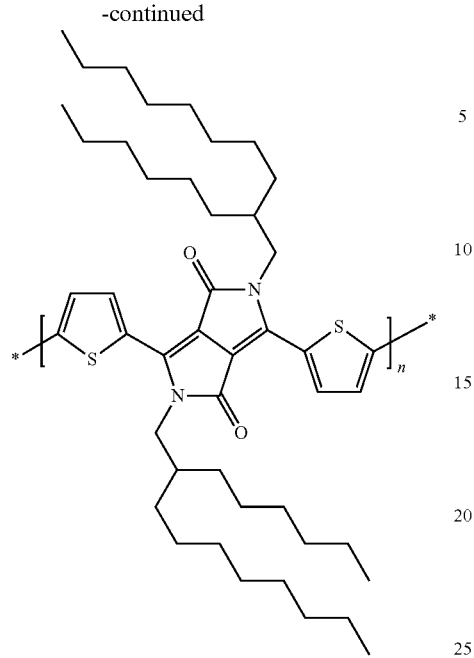
Additional examples of homopolymers are:
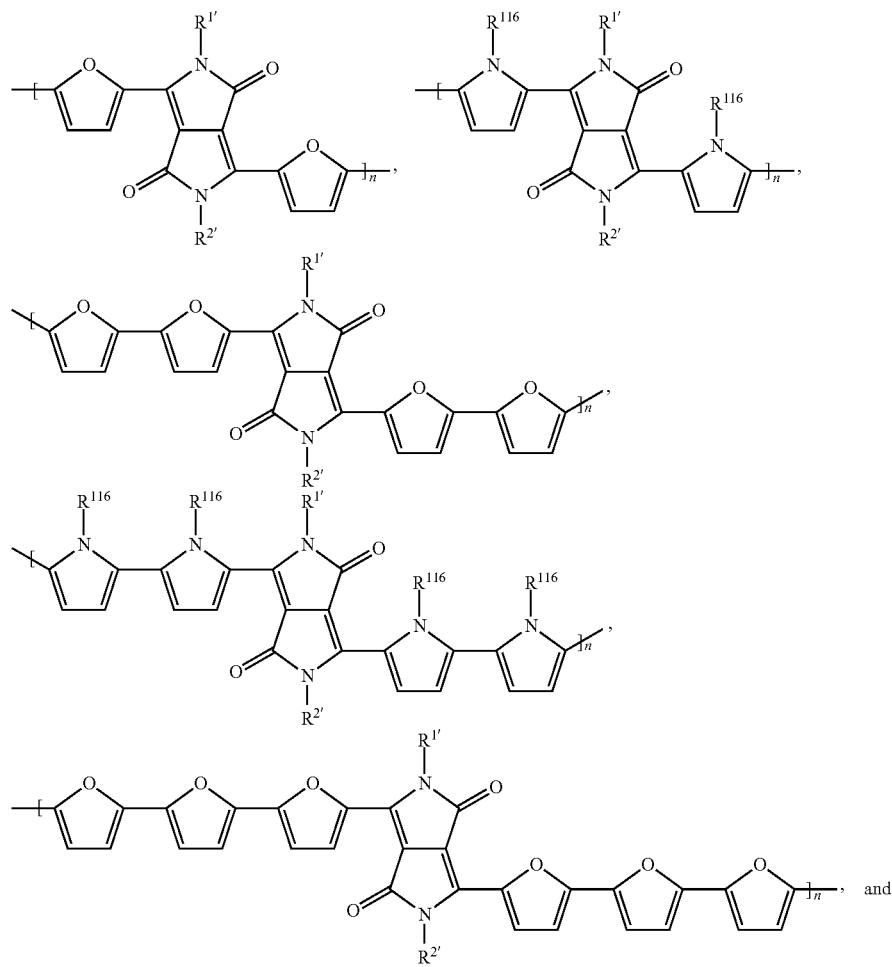
and

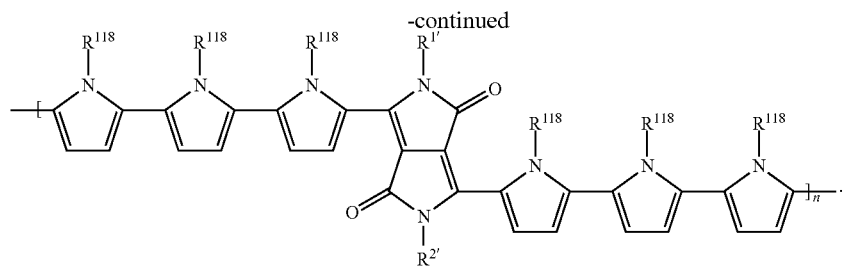

Polymerization of "AA-type and BB-type compounds" results in copolymers. If the copolymers derive from three different compounds A ("BB-type compound"), B ("AA-type compound") and D ("BB-type compound"), they are preferably (random) copolymers of formula

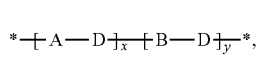

wherein x=0.995 to 0.005, y=0.005 to 0.995, especially x=0.2 to 0.8, y=0.8 to 0.2, and wherein x+y=1. If the copolymers derive from three different compounds A ("BB-type compound"), B ("AA-type compound"), D ("BB-type compound") and E ("AA-type compound"), they are preferably (random) copolymers of formula

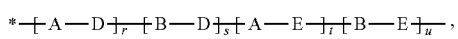

wherein r=0.985 to 0.005, s=0.005 to 0.985, t=0.005 to 0.985, u=0.005 to 0.985, and wherein r+s+t+u=1.

In a preferred embodiment of the present invention the polymers comprise repeating units of the formula

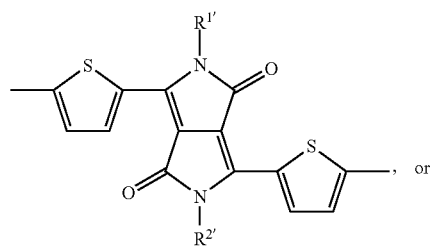

, or

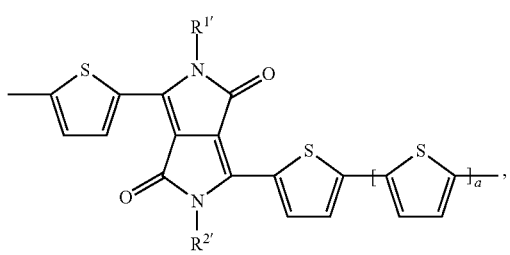

wherein a is an integer of 1 to 5, especially 1 to 3, very especially 1, or 2.

In another preferred embodiment of the present invention the polymers comprise repeating units of the formula

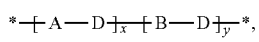

wherein A is a group of formula

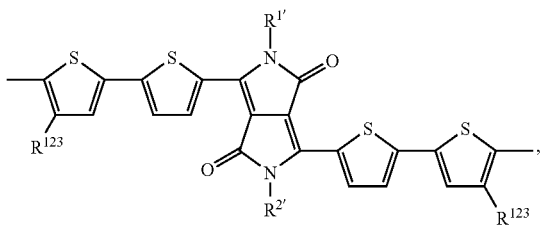

(Ia)

$R^{1'}$ and $R^{2'}$ are a $C_8$-$C_{35}$alkyl group,
$R^{123}$ is a $C_1$-$C_{18}$alkyl group,
B is a group of formula

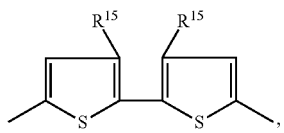

$R^{15}$ is a $C_4$-$C_{18}$alkyl group,
D is a group of formula

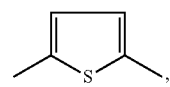

and
x=0.995 to 0.005, y=0.005 to 0.995, especially x=0.4 to 0.9, y=0.6 to 0.1, and wherein x+y=1;
A is a group of formula

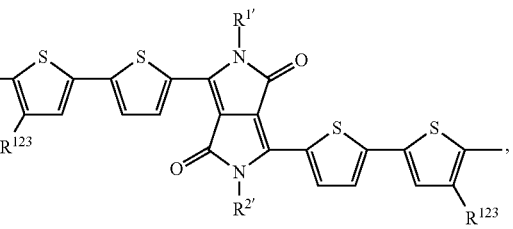

(IIi)

$R^{1'}$ and $R^{2'}$ are a $C_8$-$C_{35}$alkyl group,
$R^{123}$ is a $C_4$-$C_{18}$alkyl group,
B is a group of formula

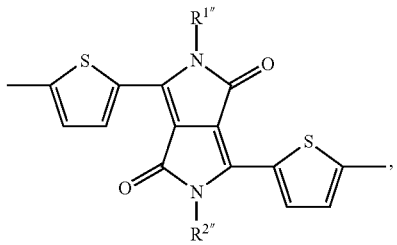
(Ia)

$R^{1''}$ and $R^{2''}$ are a $C_8$-$C_{35}$alkyl group,
D is a group of formula

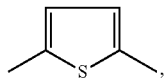

and
x=0.995 to 0.005, y=0.005 to 0.995, especially x=0.2 to 0.8, y=0.8 to 0.2, and wherein x+y=1;
wherein A is a group of formula

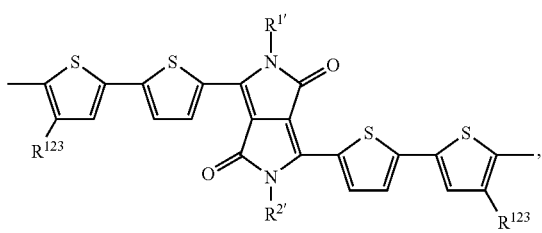
(IIi)

$R^{1'}$ and $R^{2'}$ are a $C_8$-$C_{35}$alkyl group, $R^{123}$ is a $C_4$-$C_{18}$alkyl group,
B is a group of formula

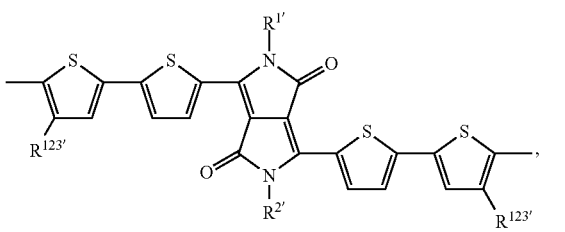
(IIi)

$R^{1''}$ and $R^{2''}$ are a $C_8$-$C_{35}$alkyl group,
$R^{123'}$ is a $C_4$-$C_{18}$alkyl group ($R^{123} \neq R^{123'}$),
D is a group of formula

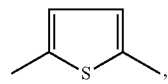

and
x=0.995 to 0.005, y=0.005 to 0.995, especially x=0.99 to 0.3, y=0.01 to 0.7, and wherein x+y=1.

Examples of particularly preferred copolymers are shown below:

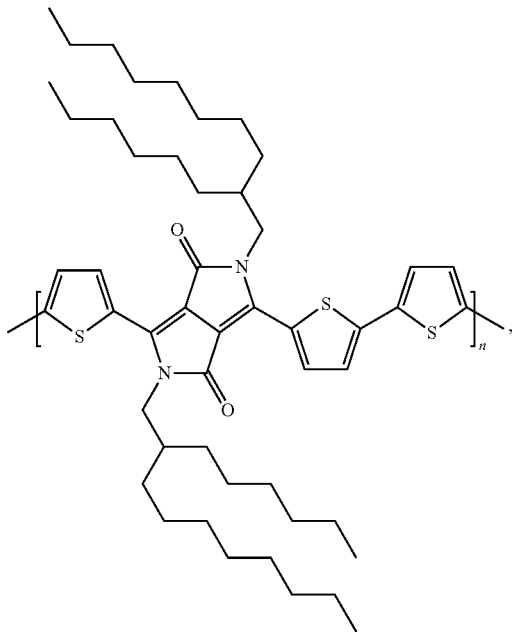
,
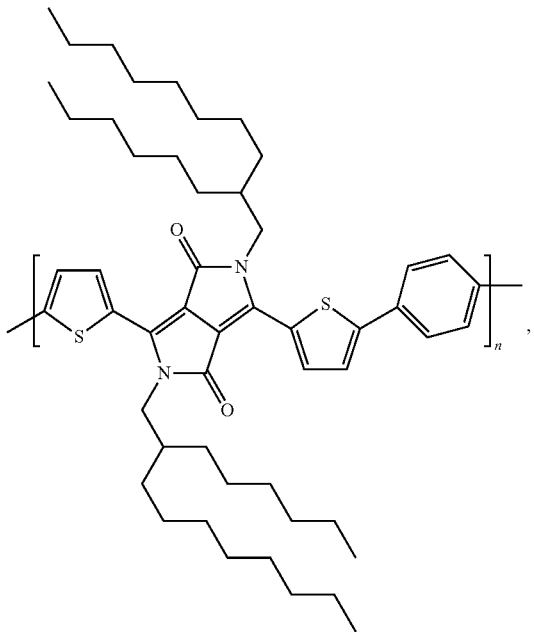
,

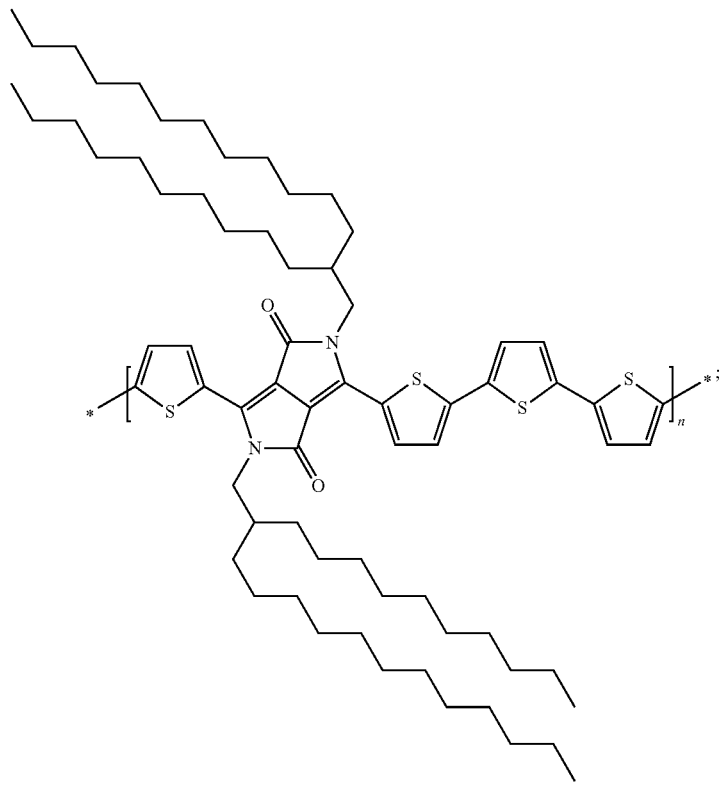
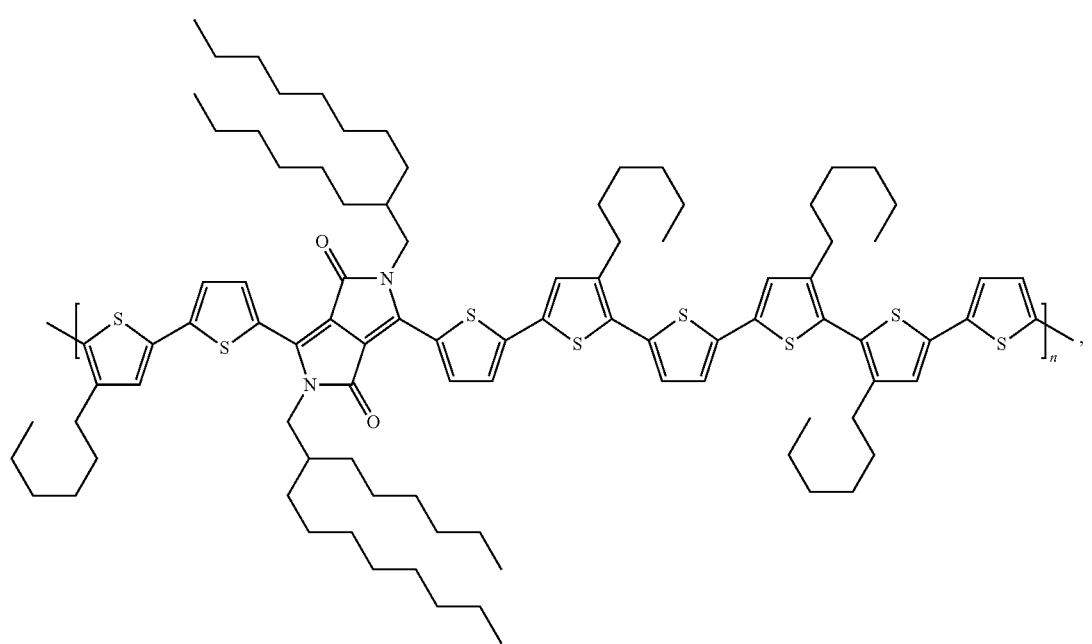

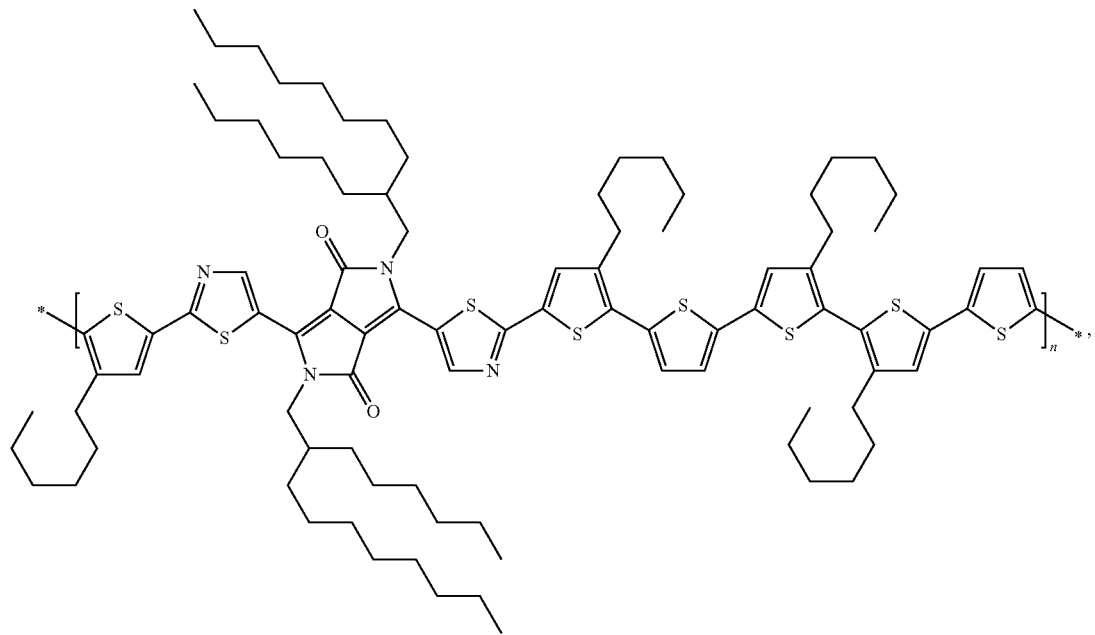
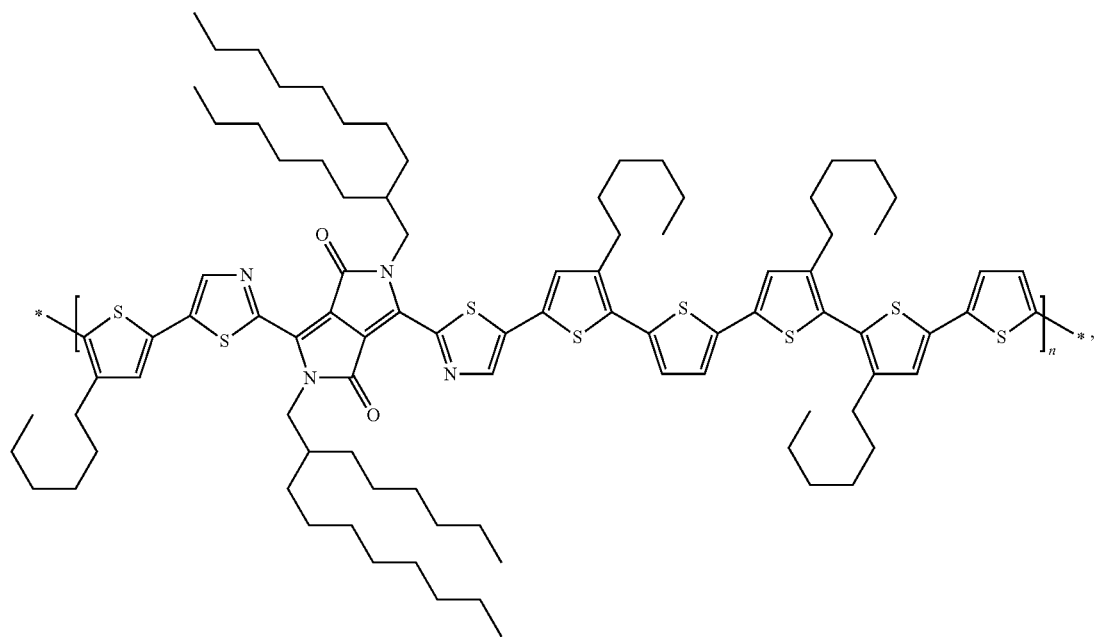

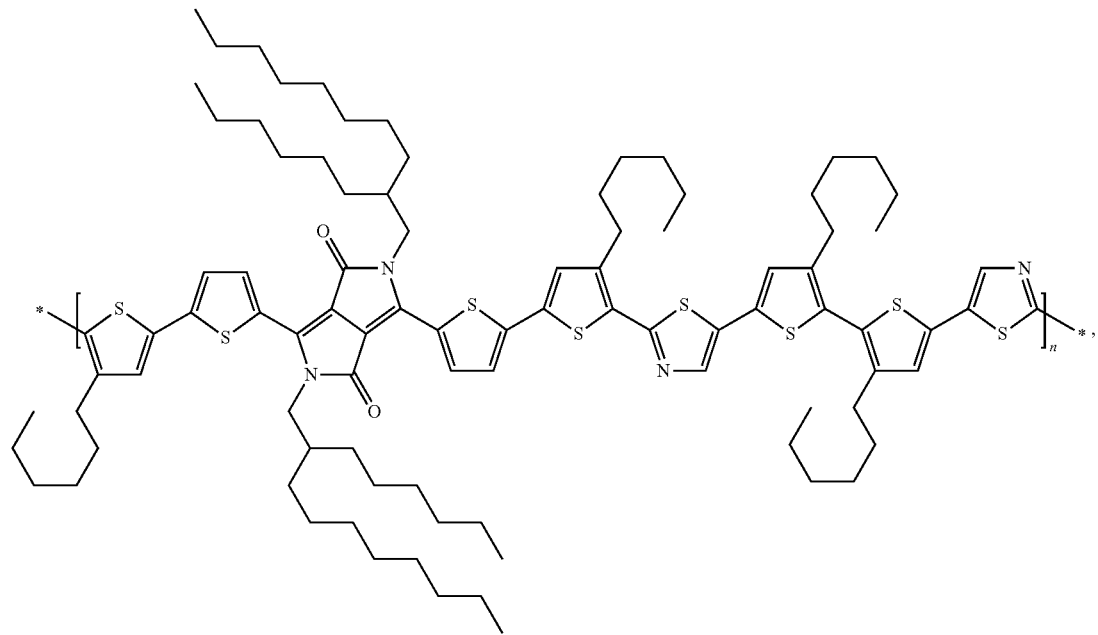
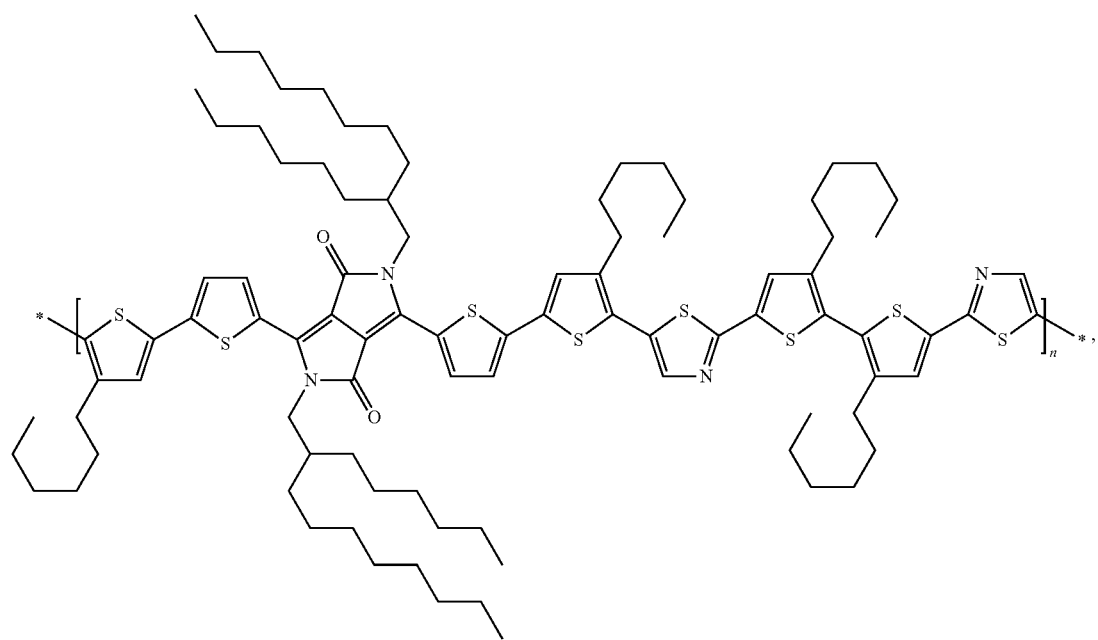

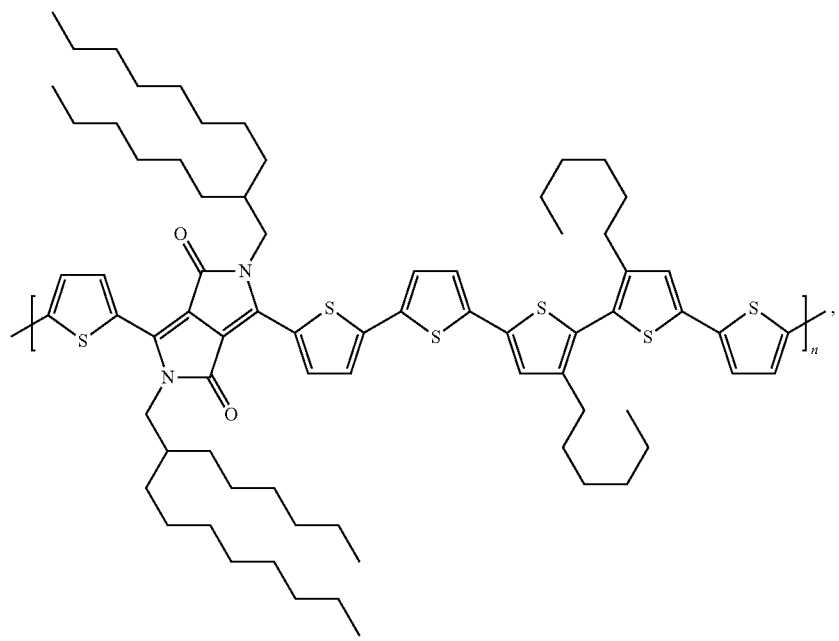
n is 4 to 200, very especially 15 to 100;
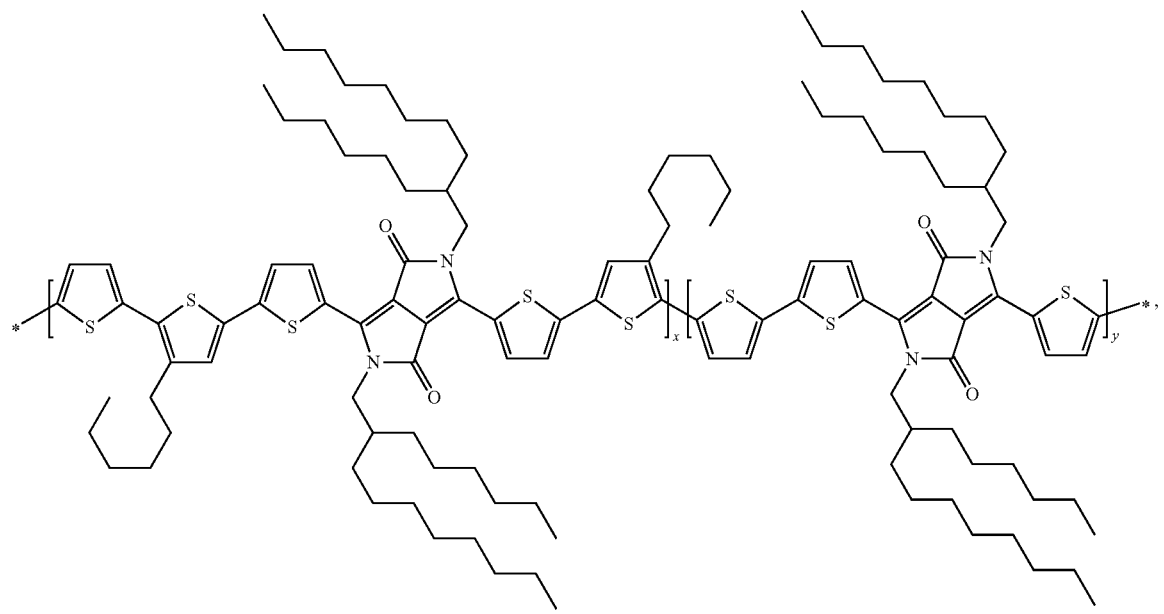
(x = 0.2 to 0.8 and y = 0.8 to 0.2)

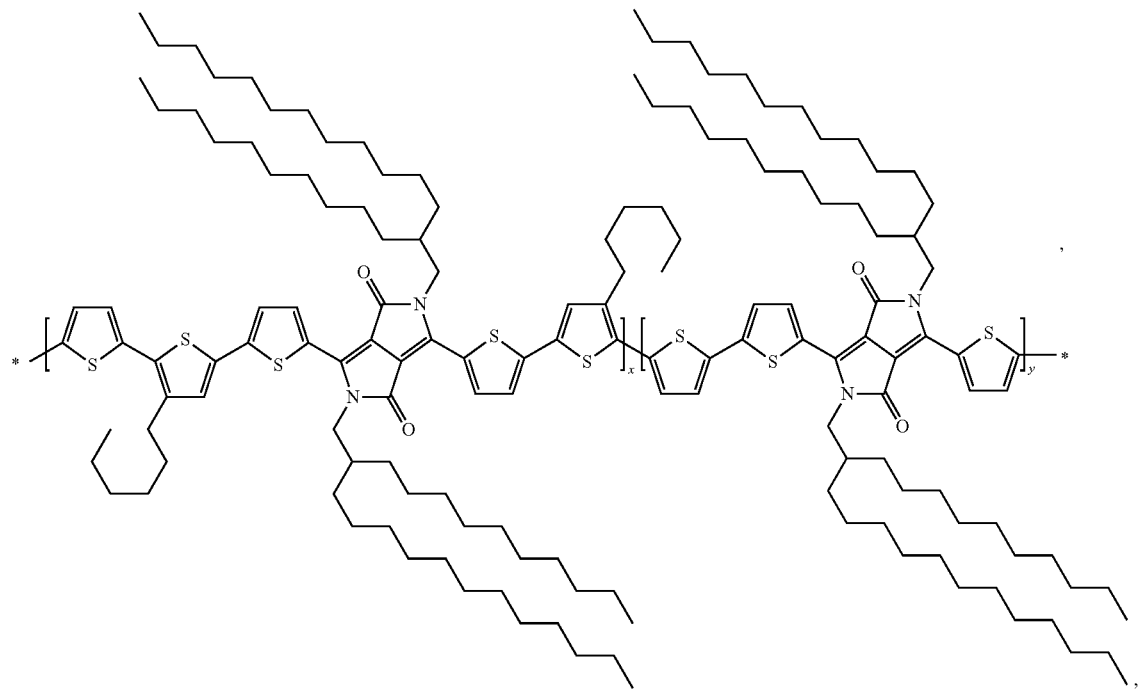
(x = 0.2 to 0.8 and y = 0.8 to 0.2)
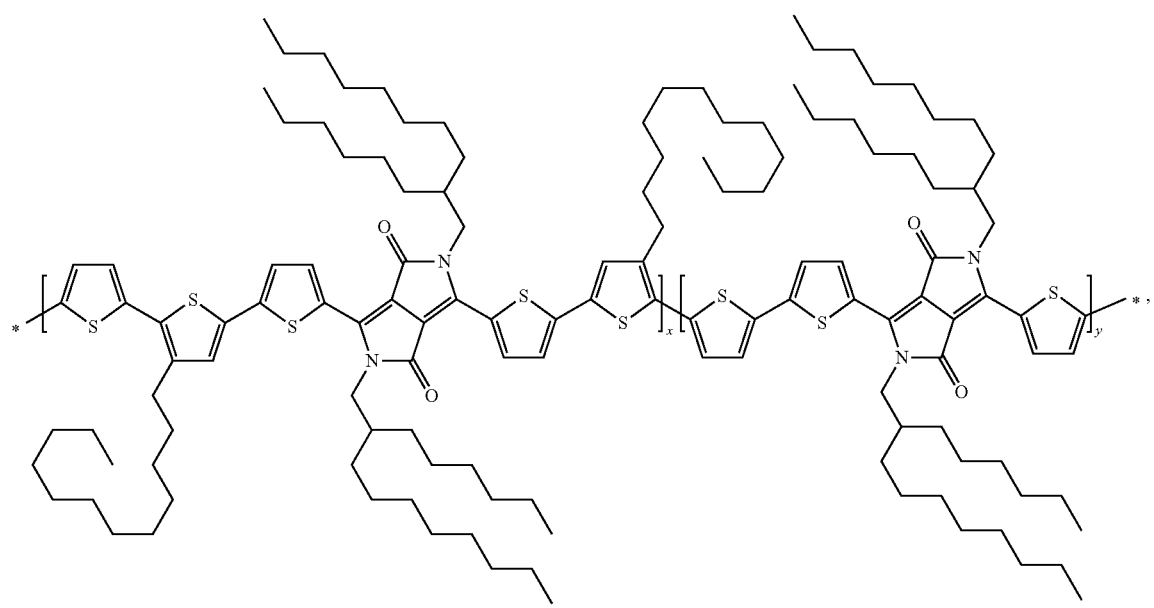
(x = 0.2 to 0.8 and y = 0.8 to 0.2)

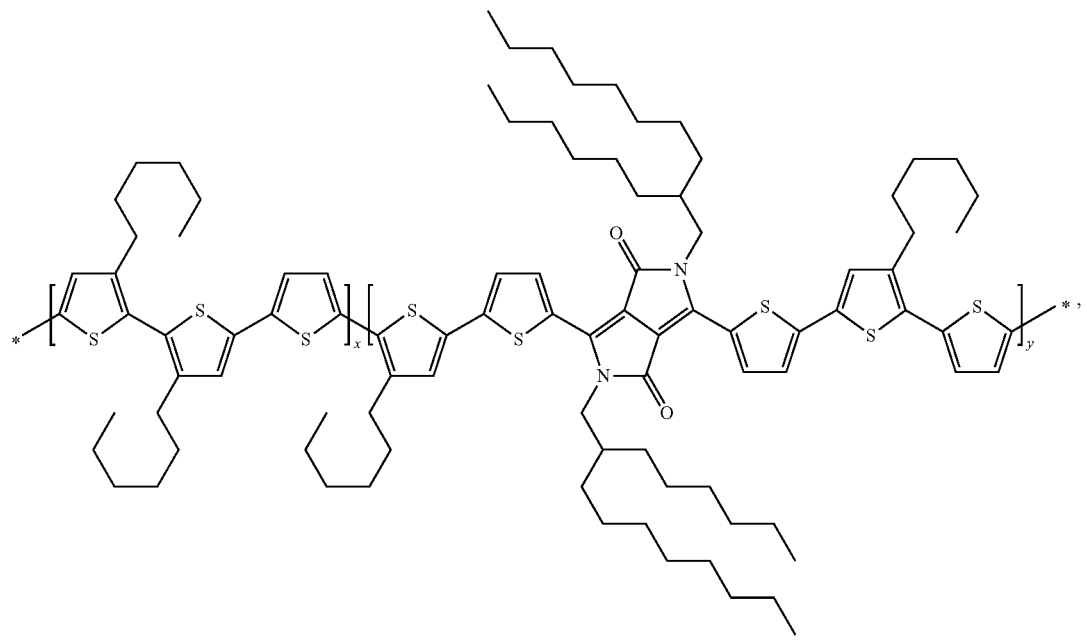
(x = 0.05 to 0.8 and y = 0.95 to 0.2)
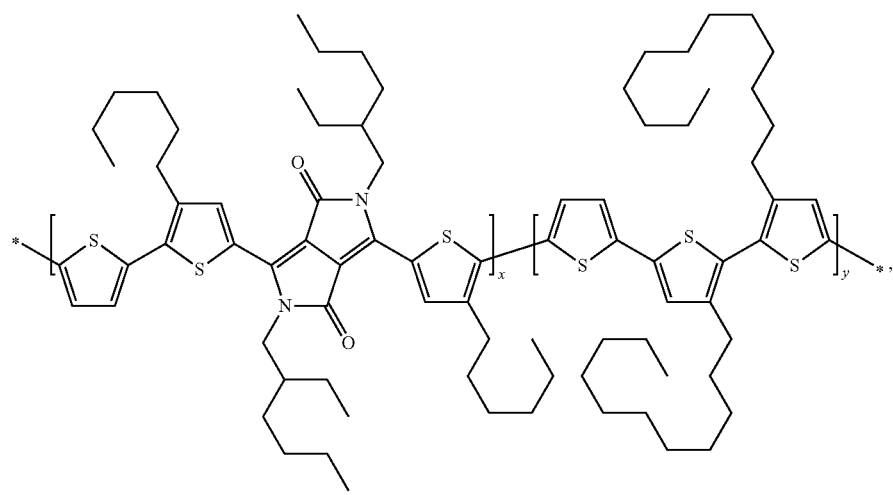
(x = 0.05 to 0.8 and y = 0.95 to 0.2)

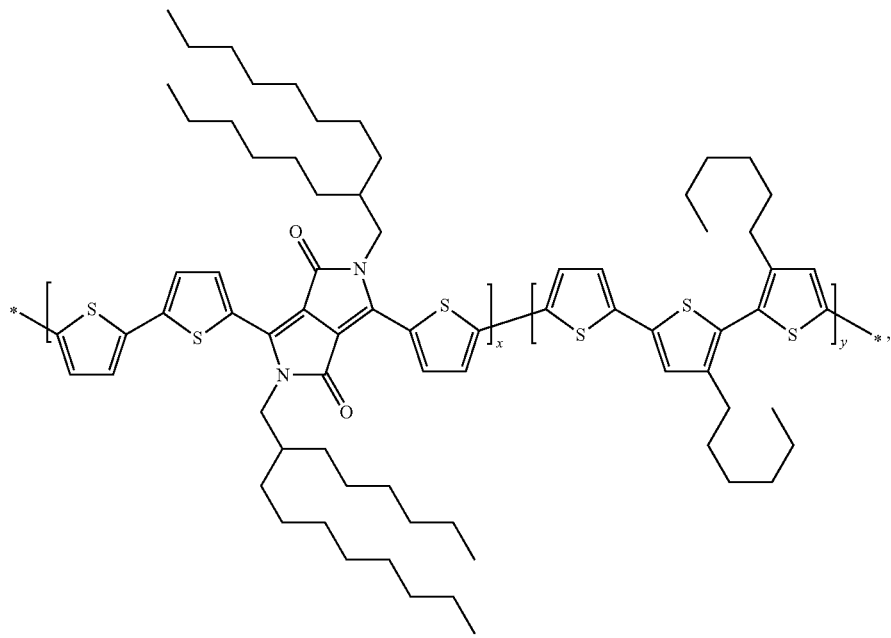
(x = 0.05 to 0.8 and y = 0.95 to 0.2)
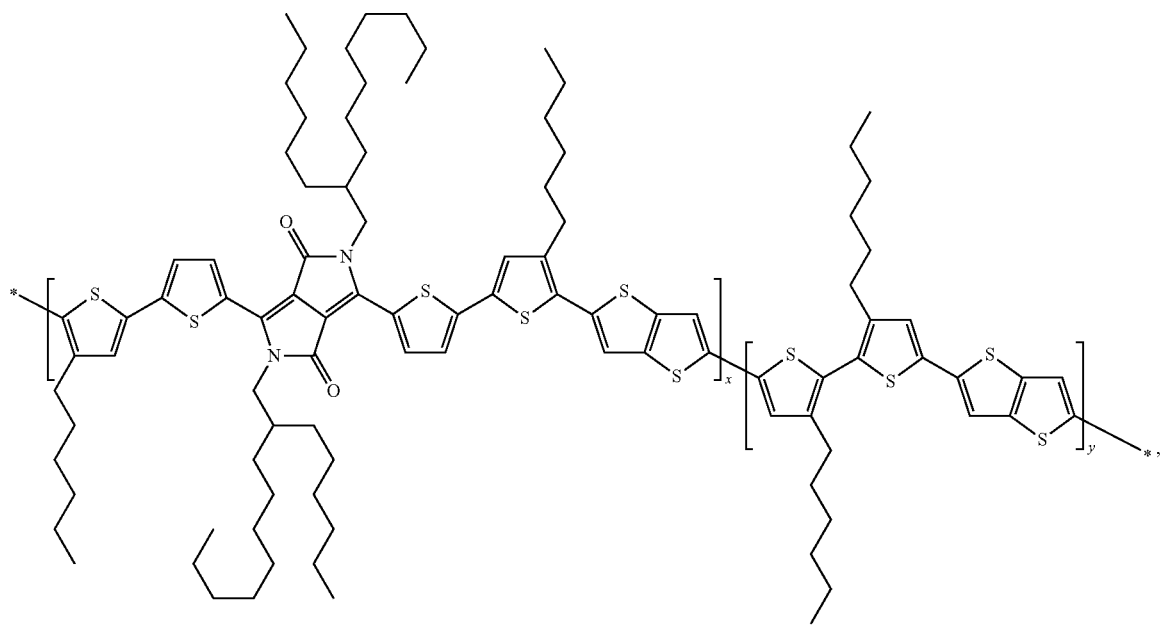
(x = 0.2 to 0.8 and y = 0.8 to 0.2)

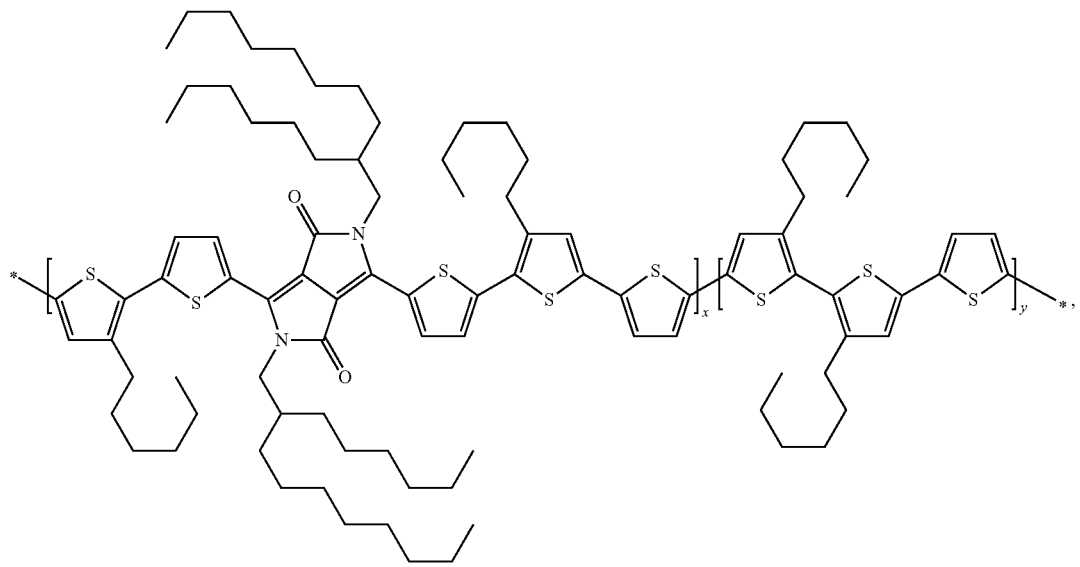
(x = 0.2 to 0.8 and y = 0.8 to 0.2)
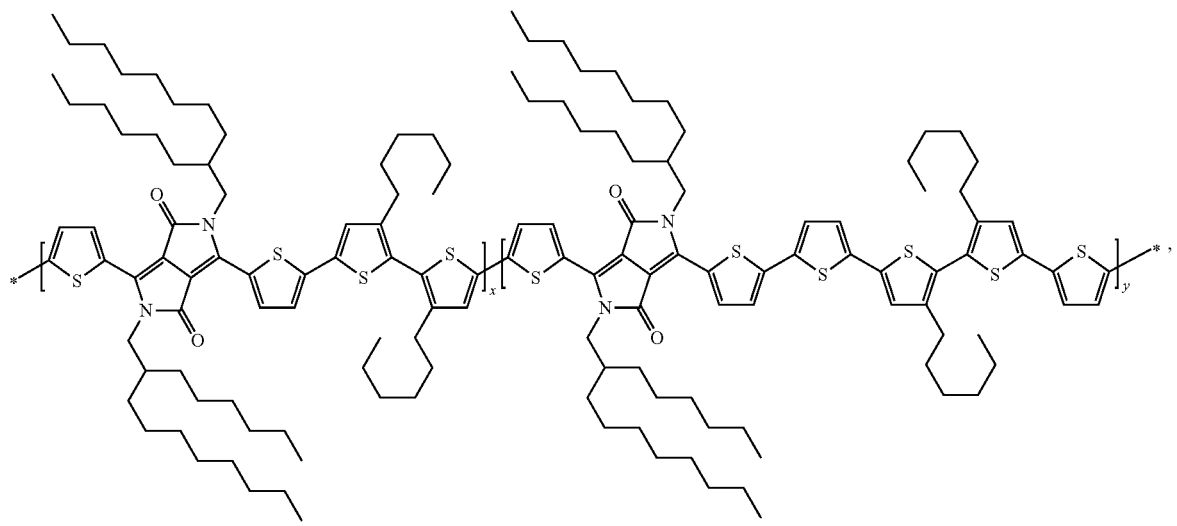
(x = 0.2 to 0.8 and y = 0.8 to 0.2)

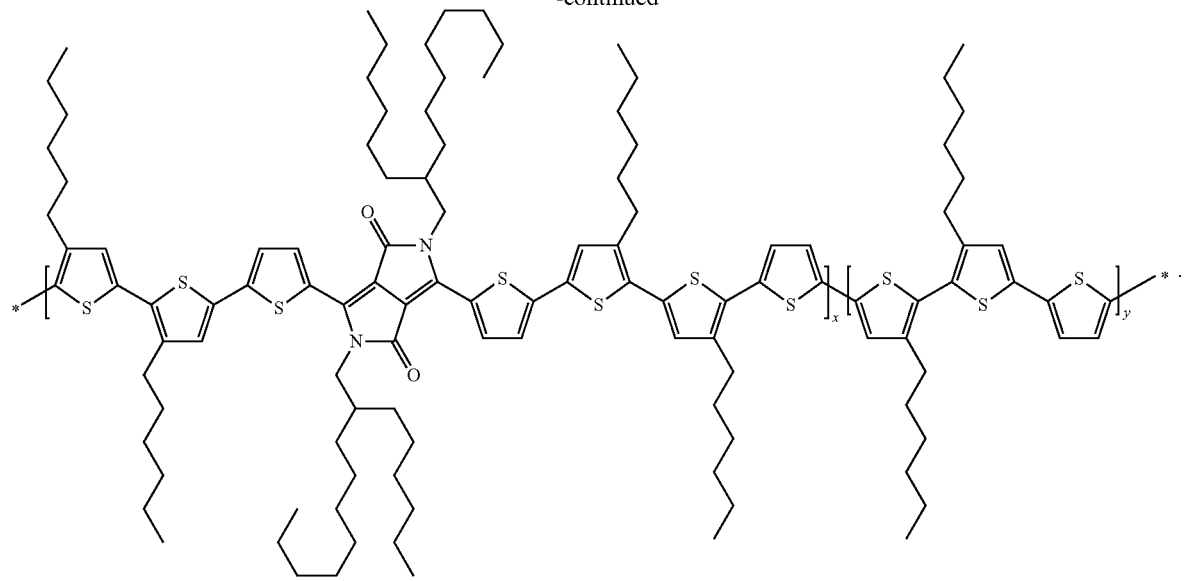

(x = 0.2 to 0.8 and y = 0.8 to 0.2)

The polymer obtained by the process according to the present invention preferably has a degree of polymerisation of at least 10, more preferably 20, most preferably at least 30. n is preferably 4 to 200, very especially 15 to 100. Preferred molecular weights are at least 10,000, more preferably at least 20,000, most preferably at least 30,000. The polymers of this invention preferably have a weight average molecular weight of 4,000 Daltons or greater, especially 4,000 to 2,000,000 Daltons, more preferably 10,000 to 1,000,000 and most preferably 10,000 to 100,000 Daltons. The at present most preferred polymers have a weight average molecular weight of 30,000 to 80,000 Daltons. Molecular weights are determined according to high-temperature gel permeation chromatography (HT-GPC) using polystyrene standards. The polymers of this invention preferably have a polydispersibility of 1.01 to 10, more preferably 1.1 to 3.0, most preferred 1.5 to 2.5.

After polymerisation the polymer is preferably recovered from the reaction mixture, for example by conventional work-up, and purified. This can be achieved according to standard methods known to the expert and described in the literature.

Optionally the terminal groups of the polymer are chemically modified ('endcapped') during or after polymerisation. Endcapping can be carried out for example by adding monofunctional compounds of formula I, II, III, IV, or commercially available monofunctional compounds, for example,

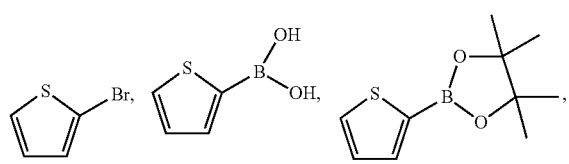

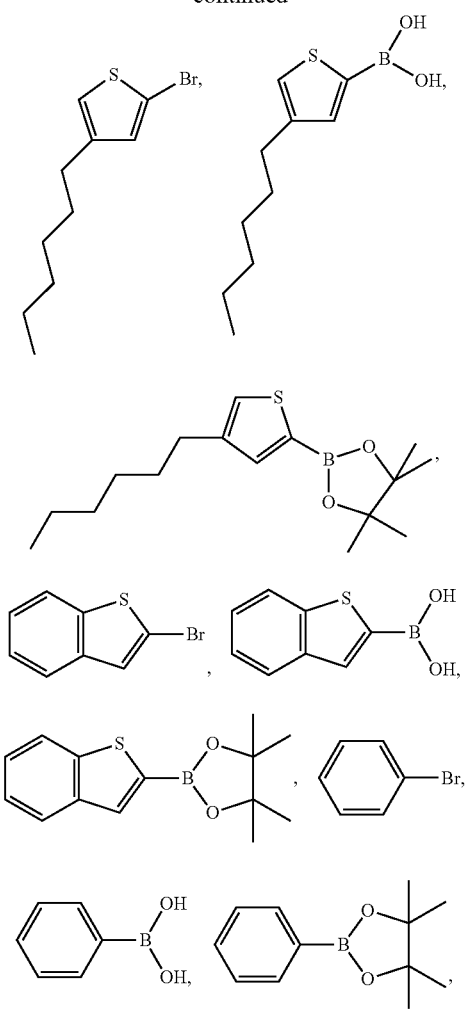

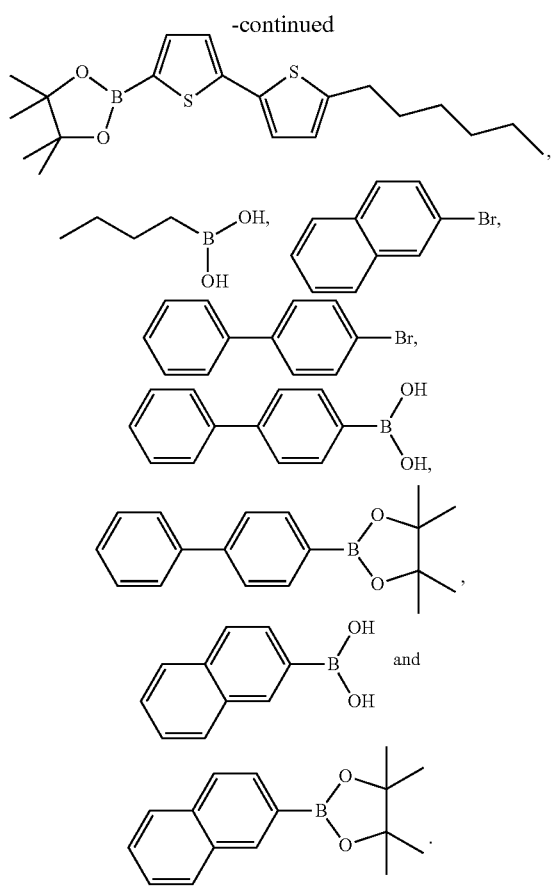

Simple commercial monofunctional compounds are typically used, but monofunctional derivatives of formula I, II, III, or IV, can also be used.

It is possible to control the sequencing of the monomeric units in the resulting copolymer by controlling the order and composition of monomer feeds in the Suzuki reaction.

Endcapping can be carried out at the end of the reaction by addition of an 'endcapper' (i.e. a monofunctional compound of formula I, or II or a commercial monofunctional compound). Alternatively, endcapping can be carried out 'in situ' by addition of a small quantity of 'endcapper' to the reaction mixture at the beginning of the reaction. The incorporation of an 'in situ' endcapper also controls the molecular weight of the polymer obtained, where the molecular weight obtained is dependent on the molar quantity of endcapper used.

Before recovering the polymer from the polymerisation reaction mixture, it may be preferable to add a co-solvent(s), for example toluene or chlorobenzene, to the reaction mixture in order to solubilise any precipitated polymer. The purpose of this is to aid the recovery of the polymer from the reaction mixture and therefore improve the isolated yield of the polymer.

The compounds and polymers prepared by the process according to the present invention can be used as semiconductors, which have high charge mobility, good processability and oxidative stability.

The following examples are included for illustrative purposes only and do not limit the scope of the claims.

Unless otherwise stated, all parts and percentages are by weight.

Weight-average molecular weight (Mw) and polydispersity (Mw/Mn=PD) are determined by Heat Temperature Gel Permeation Chromatography (HT-GPC) [Apparatus: GPC PL 220 from Polymer laboratories (Church Stretton, UK; now Varian) yielding the responses from refractive index (RI), Chromatographic conditions: Column: 3 "PLgel Olexis" column from Polymer Laboratories (Church Stretton, UK); with an average particle size of 13 μm (dimensions 300×8 mm I.D.) Mobile phase: 1,2,4-trichlorobenzene purified by vacuum distillation and stabilised by butylhydroxytoluene (BHT, 200 mg/l), Chromatographic temperature: 150° C.; Mobile phase flow: 1 ml/min; Solute concentration: about 1 mg/ml; Injection volume: 200 μl; Detection: RI, Procedure of molecular weight calibration: Relative calibration is done by use of a set of 10 polystyrene calibration standards obtained from Polymer Laboratories (Church Stretton, UK) spanning the molecular weight range from 1'930'000 Da-5'050 Da, i.e., PS 1'930'000, PS 1'460'000, PS 1'075'000, PS 560'000, PS 330'000, PS 96'000, PS 52'000, PS 30'300, PS 10'100, PS 5'050 Da. A polynomic calibration is used to calculate the molecular weight.

All polymer structures given in the examples below are idealized representations of the polymer products obtained via the polymerization procedures described. If more than two components are copolymerized with each other sequences in the polymers can be either alternating or random depending on the polymerisation conditions.

EXAMPLES

Example 1

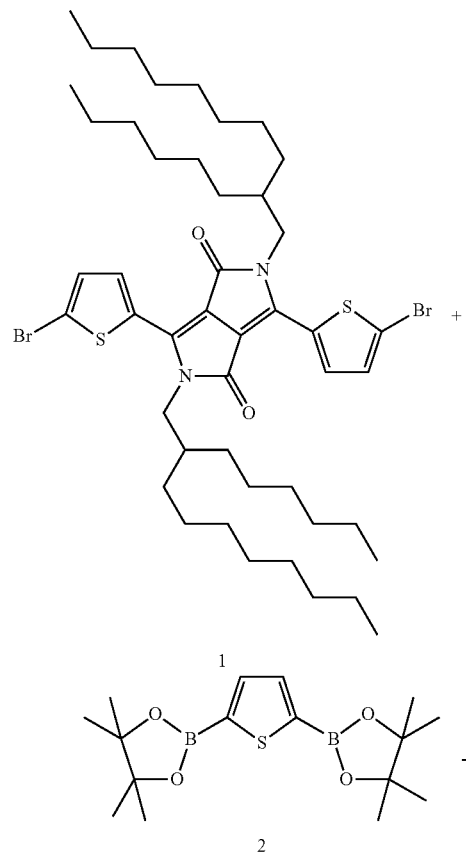

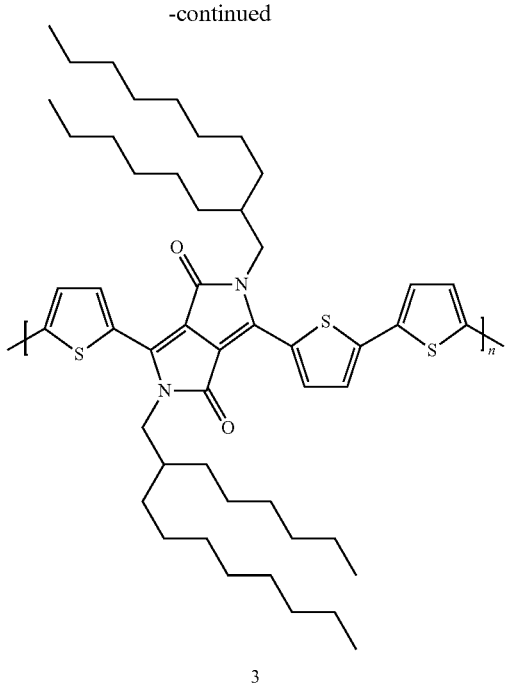

3

In a three neck-flask, 9.6 g of compound 1 (prepared according to example 2a of WO2008000664) and one equivalent (3.66 g) of compound 2 are added to 100 ml of tetrahydrofurane at room temperature. The mixture is stirred and during 30 minutes argon is bubbled through. Then 0.064 g of the 2-(di-tert-butyl-phosphino)-1-phenyl-pyrrole and 0.012 g palladium(II)acetate together with 20 ml tetrahydrofurane are added and one more hour bubbled with argon. Then the reaction mixture is heated under stirring to reflux temperature and 2.66 g LiOH*H$_2$O are added. The reaction mixture is refluxed for 1 hour. The reaction mixture is cooled to room temperature and precipitated in methanol. The filtrate is washed with water and dissolved in chloroform. The chloroform solution is washed with water. The product is then precipitated with Methanol, filtered and the precipitate washed with acetone to give 1.45 g of a dark powder of compound 3 after drying. Mw=74'400, polydispersity=2.1 (measured by HT-GPC).

Example 2

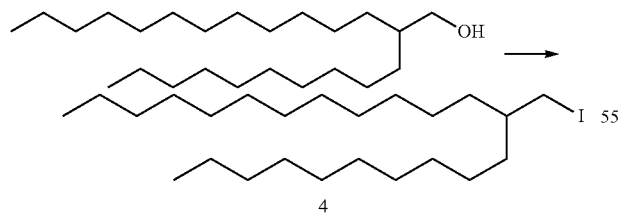

4

228.06 g of 2-decyl-1-tetradecanol are mixed with 484.51 g 47% hydroiodic acid and the mixture is refluxed overnight. The product is extracted with t-butyl-methylether. Then the organic phase is dried and concentrated. The product is purified over a silica gel column to give 211.54 g of the desired compound 4 (73%). $^1$H-NMR data (ppm, CDCl$_3$): 3.26 2H d, 1.26-1.12 41H m, 0.88 6H t;

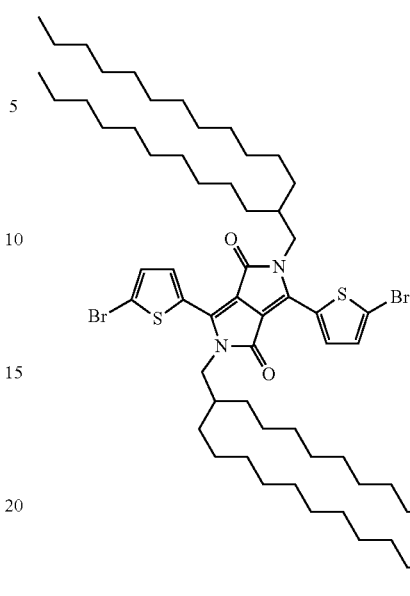

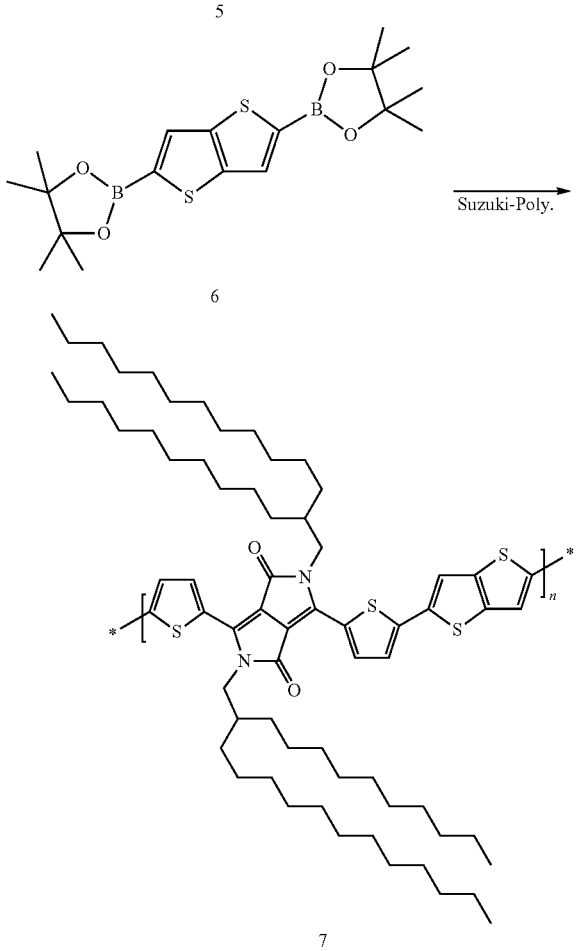

The starting material 5 is prepared according to example 2a of WO2008000664 using decyl-tetradecyl-iodide 4. 2,5-thieno[3,2-b]thiophenediboronic acid bis(pinacol) ester 6 is made e.g. by esterification of the corresponding diboronic acid (J. Org. Chem., 1978, 43(11), p 2199) with pinacol in refluxing toluene.

The polymer of formula 7 is obtained from monomers 5 and 6 in analogy to example 1 as dark powder.

Example 3

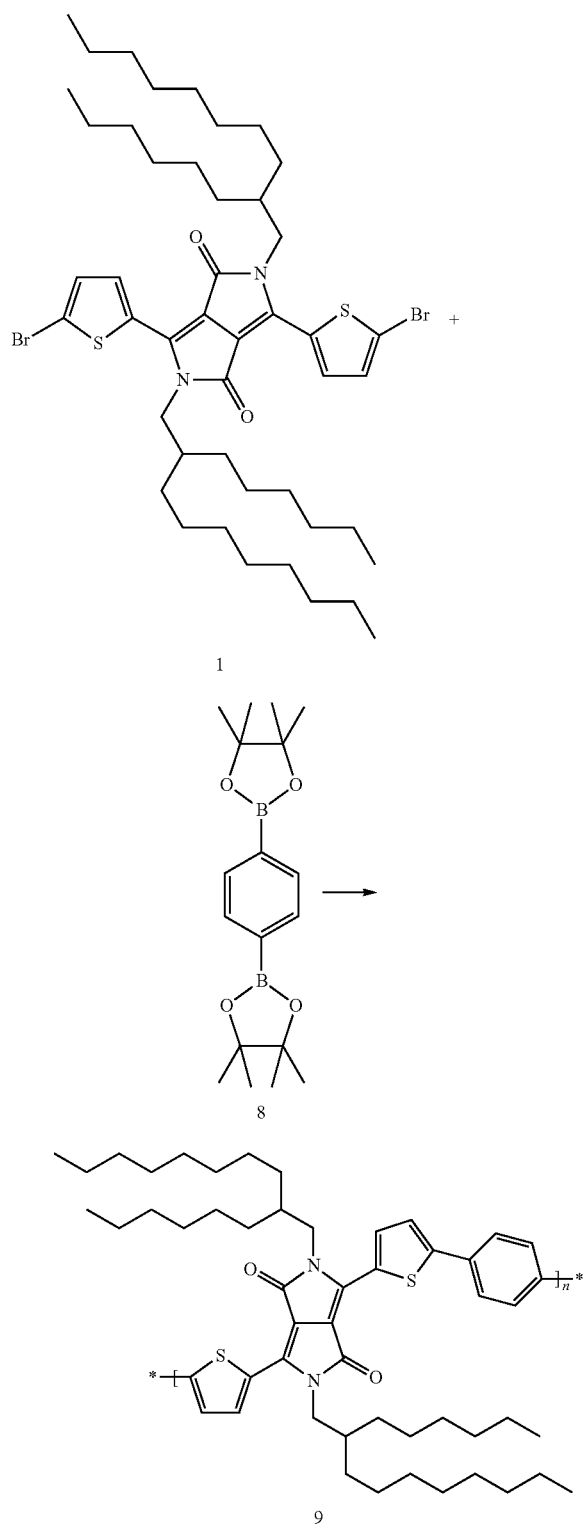

Polymer of formula 9 is obtained from monomers 1 and 8 in analogy to example 1 as dark powder, Mw=29'700, polydispersity=2.2 (measured by HT-GPC).

Example 4

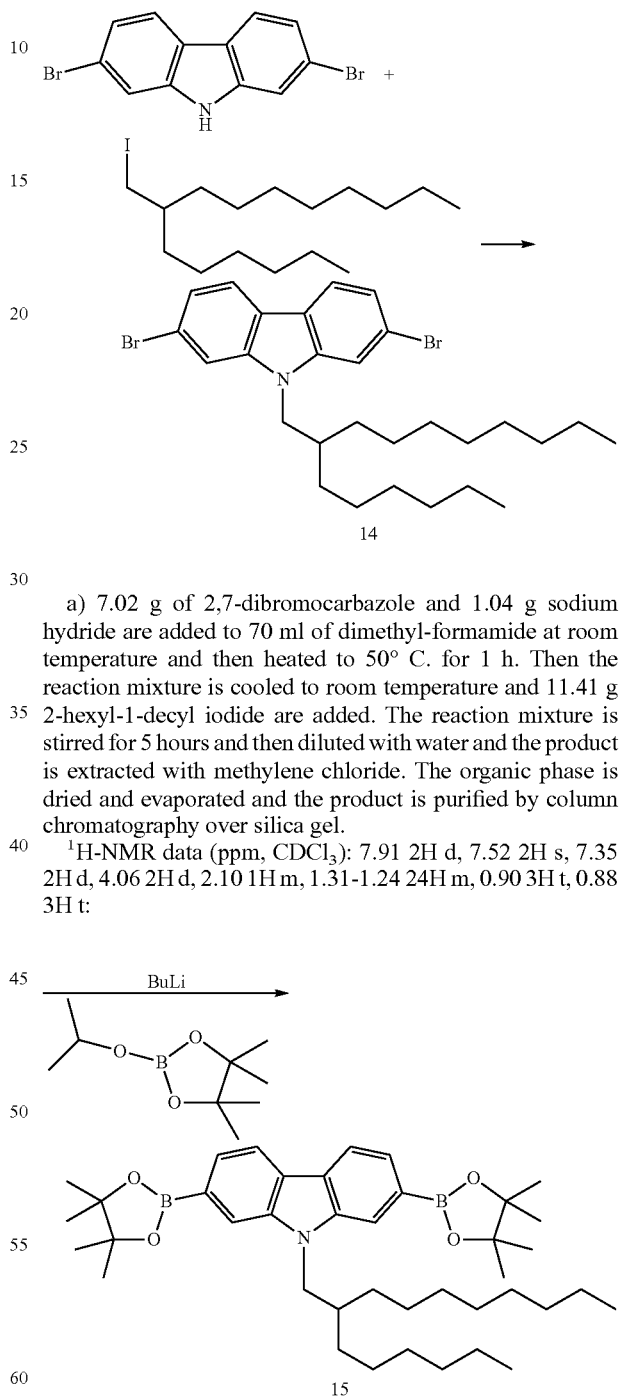

a) 7.02 g of 2,7-dibromocarbazole and 1.04 g sodium hydride are added to 70 ml of dimethyl-formamide at room temperature and then heated to 50° C. for 1 h. Then the reaction mixture is cooled to room temperature and 11.41 g 2-hexyl-1-decyl iodide are added. The reaction mixture is stirred for 5 hours and then diluted with water and the product is extracted with methylene chloride. The organic phase is dried and evaporated and the product is purified by column chromatography over silica gel.

$^1$H-NMR data (ppm, $CDCl_3$): 7.91 2H d, 7.52 2H s, 7.35 2H d, 4.06 2H d, 2.10 1H m, 1.31-1.24 24H m, 0.90 3H t, 0.88 3H t:

b) 7.36 g of 14 is dissolved in 250 ml tetrahydrofuran and the solution is cooled to −78° C. Then 10.17 ml of 2.7M buthyllithium in hexane is added and the solution stirred for 1 hour. Then 5.5 g of 2-Isopropoxy-4,4,5,5-tetramethyl-1,3,2-dioxaborolane are added dropwise and the mixture is stirred

47 another 1 hour before the temperature is raised to room temperature. The reaction mixture is poured on ice and then extracted with tert-butyl-methylether. The organic phase is dried and evaporated and the product was purified by column chromatography over silica gel.

$^1$H-NMR data (ppm, CDCl$_3$): 8.16 2H d, 7.94 2H s, 7.72 2H d, 4.30 2H d, 2.25 1H m, 1.44 24H s, 1.31-1.24 24H m, 0.92 3H t, 0.90 3H t;

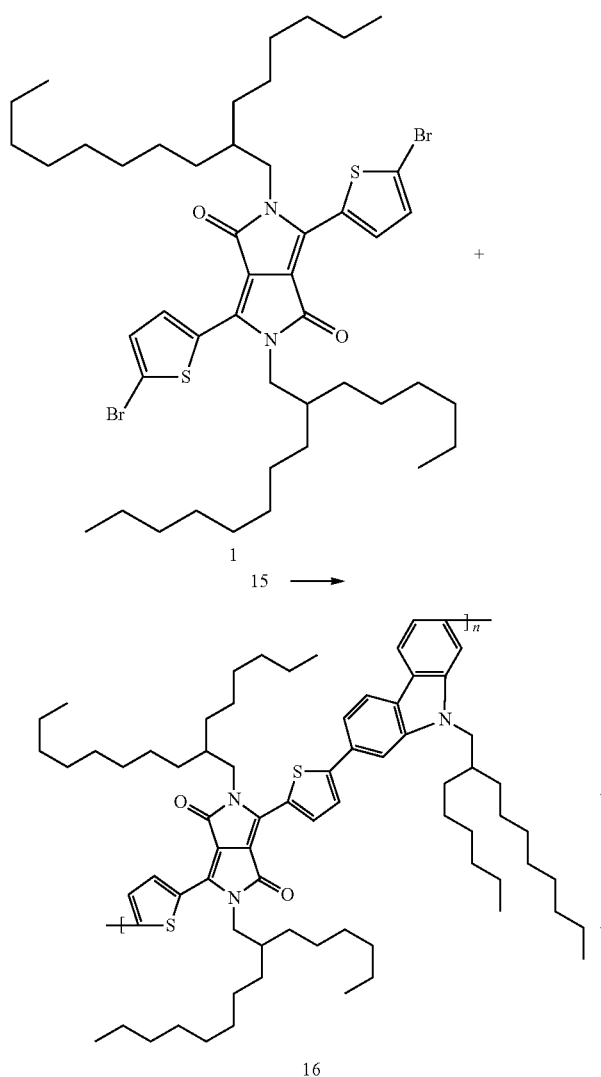

Under Argon 1.41 g of 1, 1.00 g of compound 15, 26 mg of Pd(acetate)$_2$, 22 mg of 2-(di-tert-butyl-phosphino)-1-phenyl-pyrrole are mixed with 60 ml of tetrahydrofuran and warmed to 40° C. Then a solution of 0.644 g potassium carbonate in 14 ml of degassed water is added to the reaction mixture. The reaction mixture is then brought to reflux for 4 hours and cooled to room temperature. The green-blue mixture is precipitated with methanol and filtered. The filtrate is dissolved in chloroform and refluxed with a 1% NaCN water solution for 3 hours. The organic phase is washed with water and then dried and evaporated. The polymer is precipitated with methanol and the precipitate is fractionated in a Soxhlet with hexane, and then toluene. The toluene fraction contains the desired polymer. Mw=86'500, Polydispersity=2.15 (measured by HT-GPC).

48

Example 5

Preparation of Random-Copolymer 21

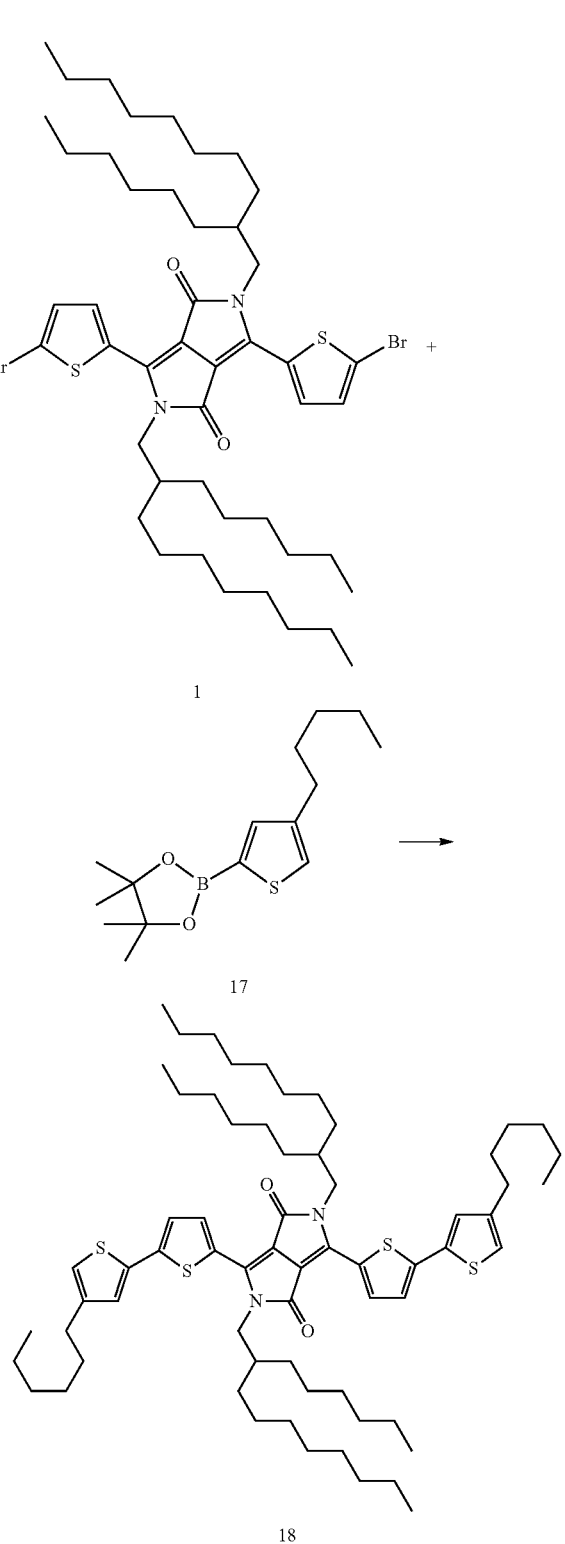

In a three neck-flask, 11.7 g of potassium phosphate (K$_3$PO$_4$) dissolved in 10 ml of water (previously degassed) are added to a degassed solution of 10.0 g of 1, 7.1 g 4-hexyl- 2-thienylboronic acid pinacol ester 17, 0.2 g of tri-tert-butylphosphonium tetrafluoroborate ((t-Bu)$_3$P*HBF$_4$) and 0.1 g of tris(dibenzylideneacetone)dipalladium(0) (Pd$_2$(dba)$_3$) in 100 ml of tetrahydrofuran. The reaction mixture is heated to reflux temperature for three hours, diluted with water and then extracted with chloroform. The organic phase is dried and evaporated. The residue is purified over silica gel and 7.5 g of the desired product 3 is obtained as violet/blue solid.

$^1$H-NMR data (ppm, CDCl$_3$): 8.88 2H d, 7.27 2H d, 7.15 2H s, 6.92 2H s, 4.04 4H d, 2.60 4H t, 1.97 2H m, 1.7-1.20 64H m, 1.0-0.8 18H m.

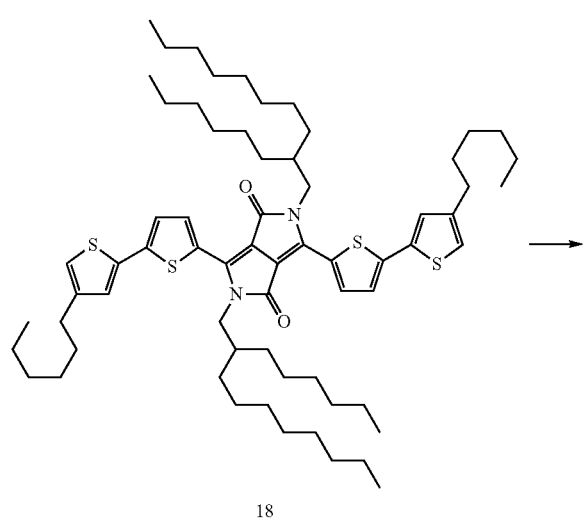

18

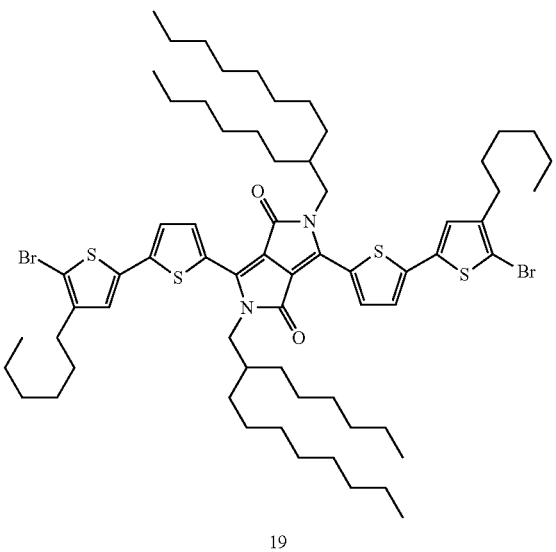

19 b) The bromination of 18, which results in 19, is done in analogy to example 2c of WO2008000664.

$^1$H-NMR data (ppm, CDCl$_3$): 8.83 2H d, 7.20 2H d, 7.00 2H s, 4.00 4H d, 2.56 4H t, 1.93 2H m, 1.7-1.20 64H m, 1.0-0.8 18H m.

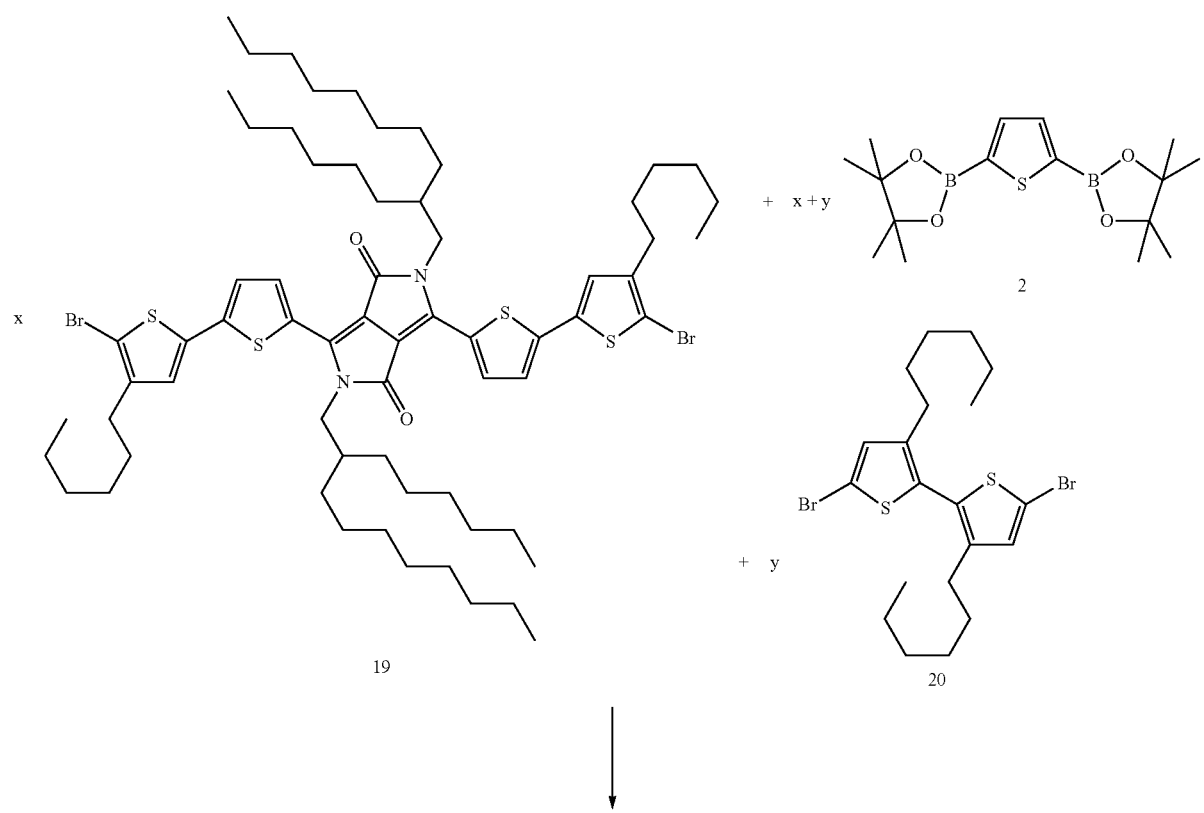

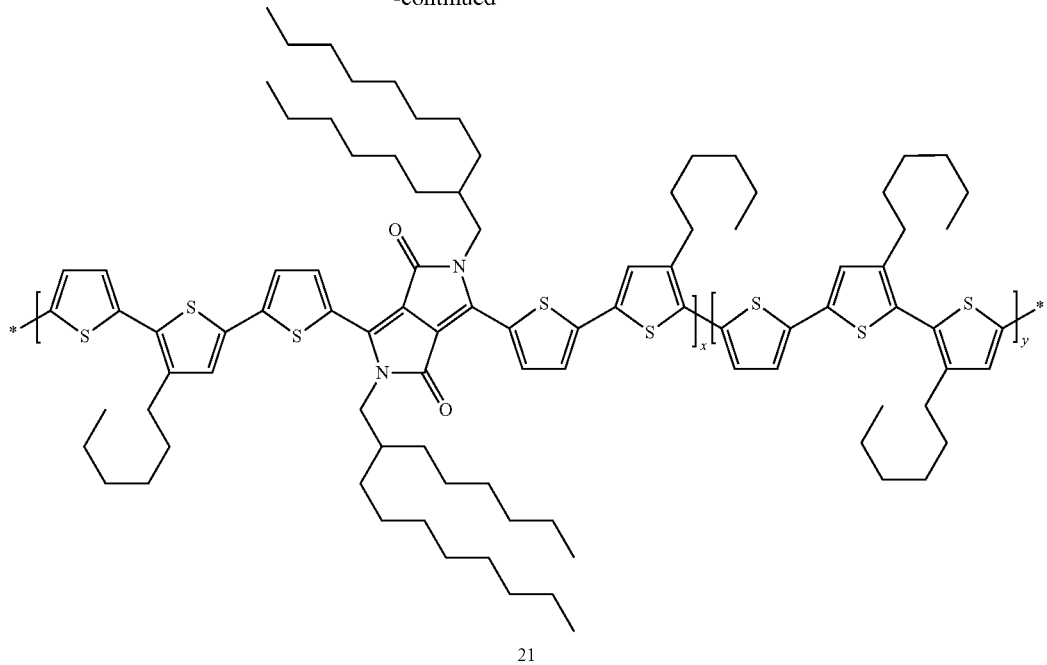

21 c) In a sulfier flask, 3.09 g of compound 19, 0.30 g of 20 and 1.03 g of compound 2 are added to 42 ml of tetrahydrofurane at room temperature. The catalyst is prepared in a three neck-flask using 0.10 g of the 2-(di-tert-butyl-phosphino)-1-phenyl-pyrrole and 0.02 g palladium(II)acetate together with 8 ml tetrahydrofurane. Inertisation is carried out with vacuum/argon for both flasks. The catalyst is then added to the reaction mixture at 55° C. and then 0.76 g LiOH*H$_2$O are added. The reaction mixture is refluxed for 1 hour. The reaction mixture is cooled to room temperature and precipitated in methanol. to give 3.0 g of a dark powder of compound 21 after drying. Mw=64'000, polydispersity=2.7 (measured by HT-GPC).

The process of the present invention enables the preparation of conjugated polymers with high molecular weight (high degree of polymerisation) and high regioregularity in large scale. In addition, nearly quantitative reaction of the monomers to the polymer can be achieved by the process of the present invention, whereby complex purification methods are avoided.

The invention claimed is:

1. A process for polymerizing or copolymerizing, the process comprising polymerizing at least one (hetero)aromatic compound in the presence of a mixture comprising:
   a) a catalyst/ligand system comprising a palladium catalyst and an organic phosphine or phosphonium compound;
   b) a base, which is a lithium salt; and
   c) at least one solvent;
wherein:
   the organic phosphine is a trisubstituted phosphine of formula (VI)

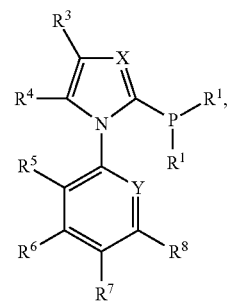

(VI)

or phosphonium salt thereof;
X independently of Y represents a nitrogen atom or a C—R$^2$ group;
Y independently of X represents a nitrogen atom or a C—R$^9$ group;
R$^1$ for each of the two R$^1$ groups independently of the other represents a radical selected from the group consisting of C$_1$-C$_{24}$-alkyl, C$_3$-C$_{20}$-cycloalkyl, which includes mono-, bi-, and tri-cyclic cycloalkyl radicals, C$_5$-C$_{14}$-aryl, which includes the phenyl, naphthyl, fluorenyl radical, and C$_2$-C$_{13}$-heteroaryl, wherein a number of heteroatoms, at least one selected from the group consisting of nitrogen, oxygen, and sulfur, is from 1 to 2;
the two radicals R$^1$ are optionally linked to one another;
the radicals R$^1$ may themselves each be independently of one another mono- or poly-substituted by at least one substituent selected from the group consisting of hydrogen, C$_1$-C$_{20}$-alkyl, C$_2$-C$_{20}$-alkenyl, C$_3$-C$_8$-cycloalkyl, C$_2$-C$_9$-hetero-alkyl, C$_5$-C$_{10}$-aryl, C$_2$-C$_9$-heteroaryl, wherein the number of heteroatoms, at least one selected from the group consisting of nitrogen, oxygen and sulfur, is from 1 to 4, C$_1$-C$_{20}$-alkoxy, C$_1$-C$_{10}$-haloalkyl, hydroxy, amino of the forms NH—(C$_1$-C$_{20}$-alkyl), NH—(C$_5$-C$_{10}$-aryl), N(C$_1$-C$_{20}$-alkyl)$_2$, N(C$_1$-C$_{20}$- alkyl) ($C_5$-$C_{10}$-aryl), N($C_5$-$C_{10}$-aryl)$_2$, N($C_1$-$C_{20}$-alkyl/$C_5$-$C_{10}$-aryl$_3$)$_3^+$, NH—CO—$C_1$-$C_{20}$-alkyl, NH—CO—$C_5$-$C_{10}$-aryl, carboxylato of the forms COOH and COOQ, wherein Q represents either a monovalent cation or $C_1$-$C_8$-alkyl, $C_1$-$C_6$-acyloxy, sulfinato, sulfonato of the forms SO$_3$H and SO$_3$Q', wherein Q' represents a monovalent cation, $C_1$-$C_{20}$-alkyl, or $C_5$-$C_{10}$-aryl, and tri-$C_1$-$C_6$-alkylsilyl, wherein two of the mentioned substituents may also be bridged with one another;

$R^2$-$R^9$ each independently of each other represent a hydrogen, alkyl, alkenyl, cycloalkyl, aromatic or heteroaromatic aryl, O-alkyl, NH-alkyl, N-(alkyl)$_2$, O-(aryl), NH-(aryl), N-(alkyl)(aryl), O—CO-alkyl, O—CO-aryl, F, Si(alkyl)$_3$, CF$_3$, CN, CO$_2$H, CHO, SO$_3$H, CONH$_2$, CONH(alkyl), CON(alkyl)$_2$, SO$_2$(alkyl), SO(alkyl), SO(aryl), SO$_2$(aryl), SO$_3$(alkyl), SO$_3$(aryl), S-alkyl, S-aryl, NH—CO(alkyl), CO$_2$(alkyl), CONH$_2$, CO(alkyl), NHCHO, NHCO$_2$(alkyl), CO(aryl), or CO$_2$(aryl) radical, wherein two or more adjacent radicals $R^2$-$R^9$ each independently of the other are optionally linked to one another to form a condensed ring system;

the $R^2$-$R^9$ alkyl represents a hydrocarbon radical having from 1 to 20 carbon atoms and optionally linear or branched;

the $R^2$-$R^9$ alkenyl represents a mono- or poly-unsaturated hydrocarbon radical having from 2 to 20 carbon atoms and optionally linear or branched;

the $R^2$-$R^9$ cycloalkyl represents a hydrocarbon having from 3 to 20 carbon atoms;

the $R^2$-$R^9$ aryl represents a 5- to 14-membered aromatic radical, wherein from one to four carbon atoms in the aryl radical are optionally substituted with at least one heteroatom selected from the group consisting of nitrogen, oxygen and sulfur so that a 5- to 14-membered heteroaromatic radical is present, and the radicals $R^2$ to $R^9$ optionally comprise at least one further substituent as defined for $R^1$; and the (hetero)aromatic compound comprises at least one functional halide group and at least one functional boron group.

2. The process of to claim 1, wherein the base is at least one selected from the group consisting of a lithium alkoxide, a lithium hydroxide, carboxylate, carbonate, fluoride and phosphate.

3. The process of claim 2, wherein the base is LiOH or LiOH.xH$_2$O.

4. The process of claim 1, wherein:

X represents a CR$^2$ group and Y represents a CR$^9$ group, or X is nitrogen and Y represents a CR$^9$ group;

R$^1$ is selected from the group consisting of a phenyl, $C_1$-$C_{10}$-alkyl, cyclopentyl, cyclohexyl, cycloheptyl, 1-adamantyl, and 2-adamantyl;

R$^2$ to R$^9$ are selected from the group consisting of hydrogen, $C_1$-$C_{10}$-alkyl, $C_2$-$C_{10}$-alkenyl, $C_1$-$C_{10}$-haloalkyl, $C_3$-$C_8$-cycloalkyl, $C_6$-$C_{10}$-aryl, and $C_2$-$C_6$-heteroaryl, wherein from 1 to 3 nitrogen atoms or an oxygen or sulfur atom is optionally present as heteroatom; and two adjacent radicals R$^2$ to R$^9$ are optionally bridged with one another.

5. The process of claim 4, wherein the catalyst/ligand system comprises an organic phosphine which is a trisubstituted phosphine of formula

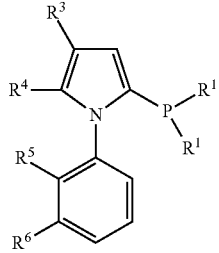

| Cpd. | R$^1$ | R$^5$ | R$^6$ | R$^3$ | R$^4$ |
|---|---|---|---|---|---|
| A-1 | 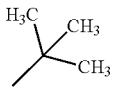 | H | H | H | H |
| A-2 | cyclohexyl | H | H | H | H |
| A-3 | phenyl | H | H | H | H |
| A-4 | adamantyl | H | H | H | H |
| A-5 | cyclohexyl | —OCH$_3$ | H | H | H |
| A-6 | cyclohexyl | 1) | 1) | H | H |
| A-7 | 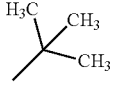 | | | H | H |
| A-8 | phenyl | 1) | 1) | H | H |
| A-9 | adamantyl | 1) | 1) | H | H |
| A-10 | cyclohexyl | H | H | 2) | 2) |
| A-11 | 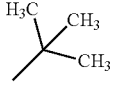 | H | H | 2) | 2) |
| A-12 | phenyl | H | H | 2) | 2) |
| A-13 | adamantyl | H | H | 2) | 2) | wherein:

1) represents that R$^5$ and R$^6$ together form a ring as  ; and 2) represents R$^3$ and R$^4$ together form a ring  .

6. The process claim 1, wherein the palladium catalyst is selected from the group consisting of a Pd(II) halide, a Pd(II) carboxylate, a Pd(II) diketonate, Pd$_2$(dba)$_3$, Pd(dba)$_2$, Pd(PR$_3$)$_2$, Pd(OAc)$_2$, PdCl$_2$(PR$_3$)$_2$, PdCl$_2$(PhCN)$_2$, PdCl$_2$(CH$_3$CN), and PdCl$_2$(COD), wherein PR$_3$ is the organic phosphine of formula (VI).

7. The process of claim 1, wherein the solvent is at least one selected from the group consisting of toluene, xylene, anisole, THF, 2-methyltetrahydrofuran, dioxane, chlorobenzene, fluorobenzene, and water.

8. The process of claim 7, wherein the solvent is at least one selected from the group consisting of THF and water.

9. The process of claim 1, wherein the at least one functional halide and the at least one boron group are attached to a 5-membered heteroaromatic ring that is optionally substituted and optionally fused to another ring.

10. The process of claim 9, wherein the at least one heteroaromatic compound is selected from the group consisting of

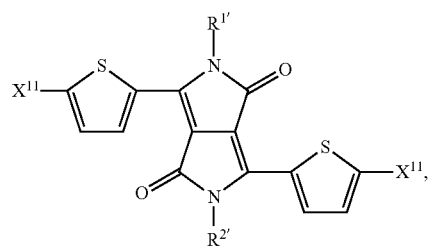 (Ia)
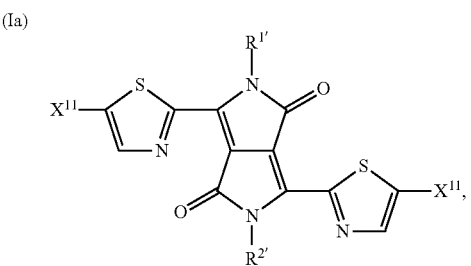 (Ib)
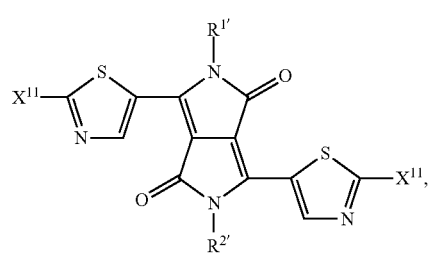 (Ic)
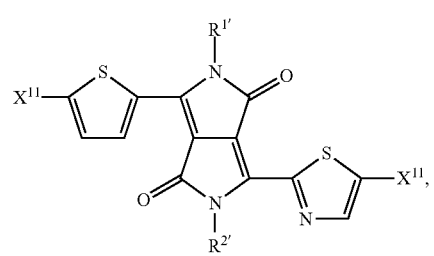 (Id)
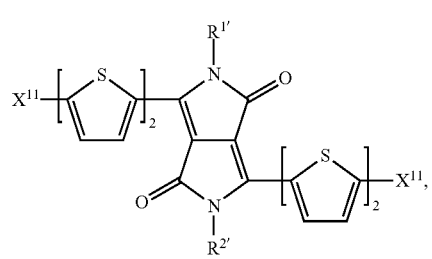 (Ie)
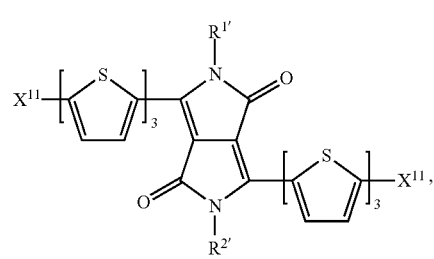 (If)
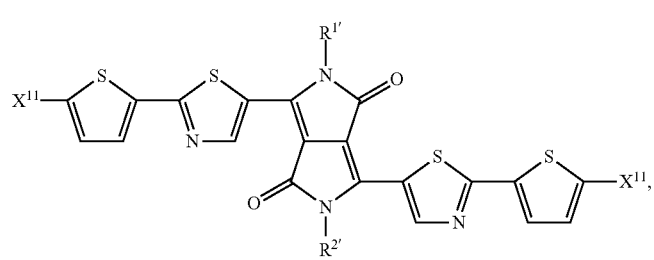 (Ig)
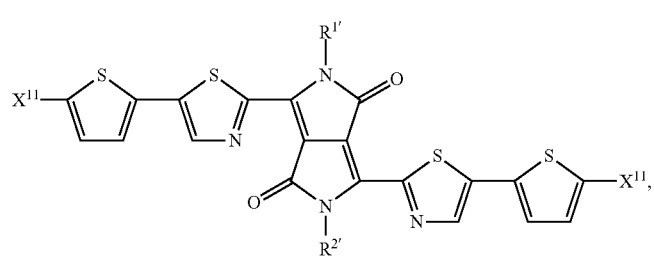 (Ih)
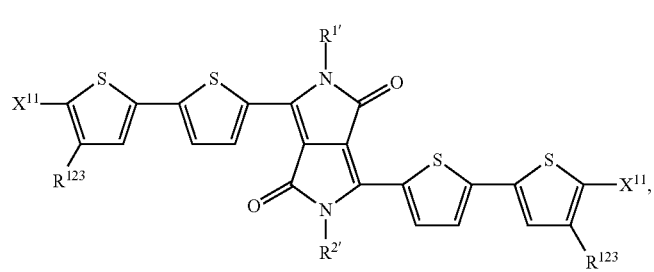 (Ii)

-continued
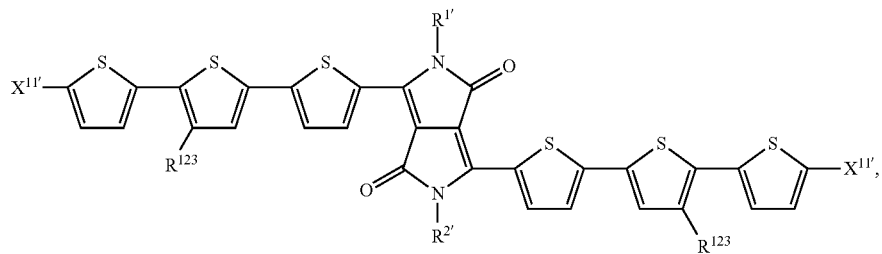
(Ij)
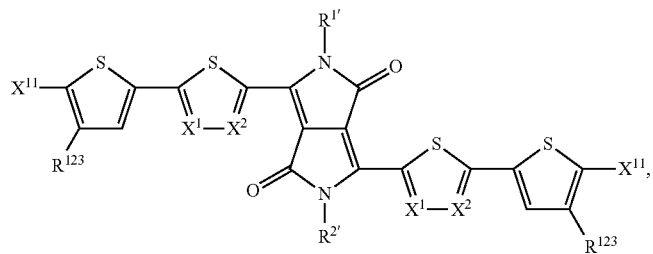
(Ik)
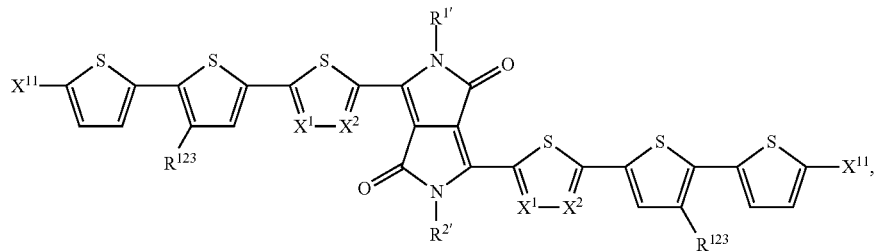
(Il)
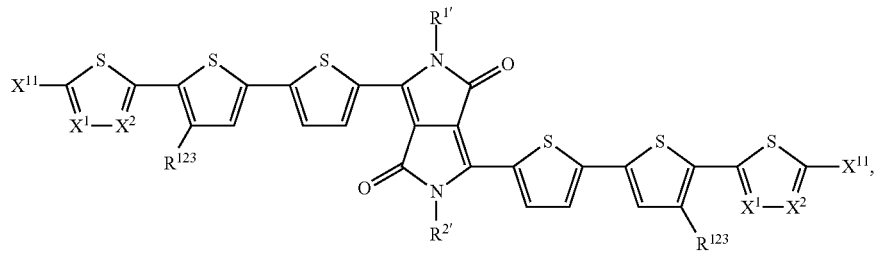
(Im)
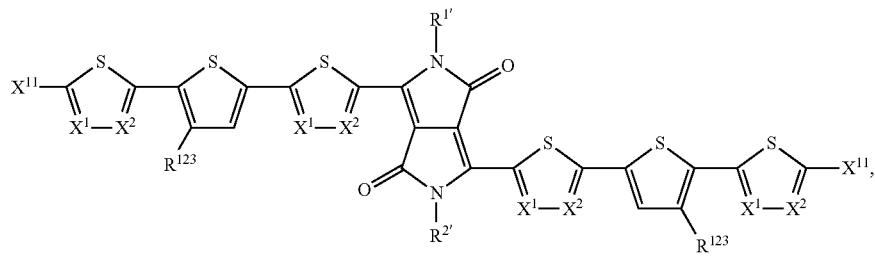
(In)
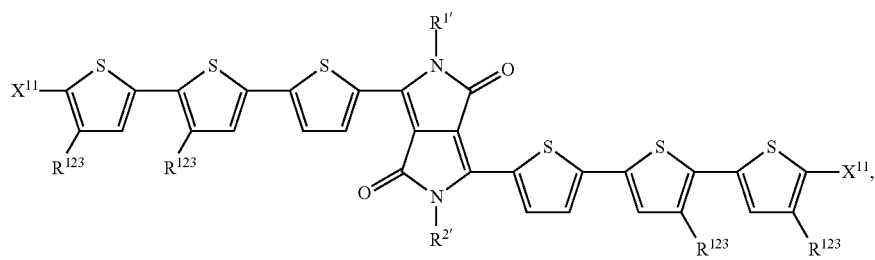
(Io)

-continued
(Ip)
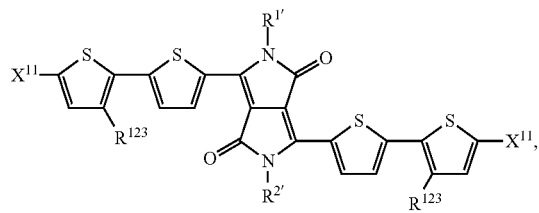
(Iq)
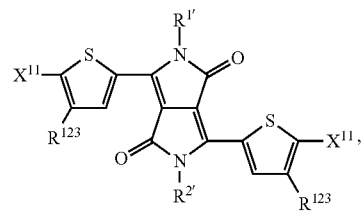
(Ir)
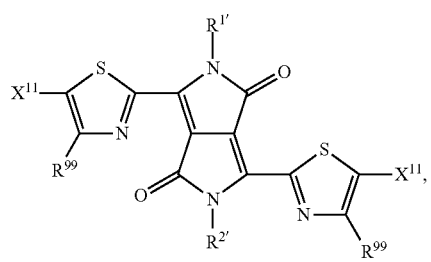
(Is)
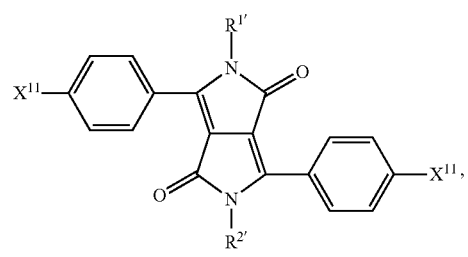
(It)
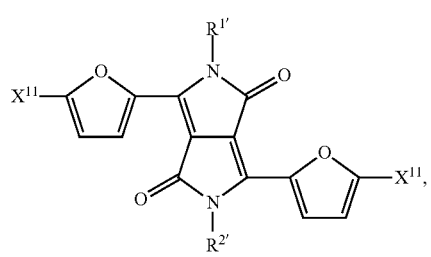
(Iu)
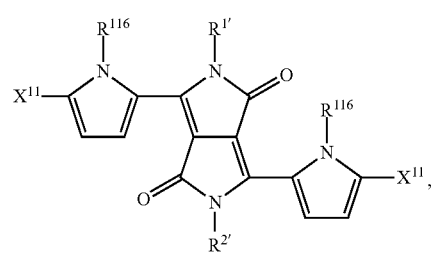
(Iv)
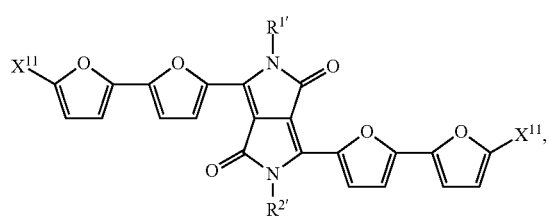
(Iw)
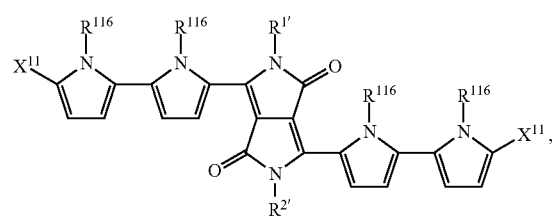
(Ix)
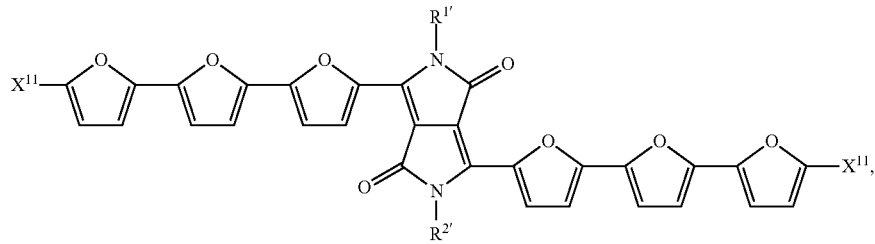
(Iy)
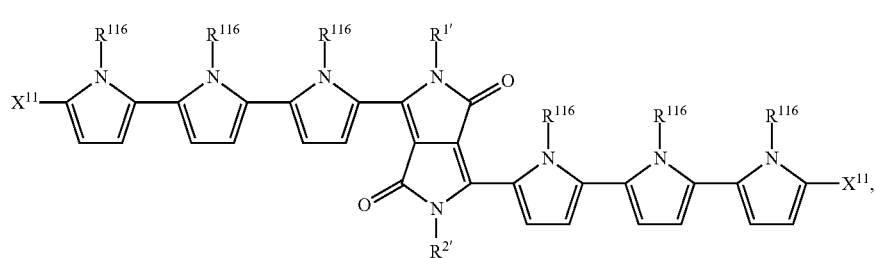

-continued
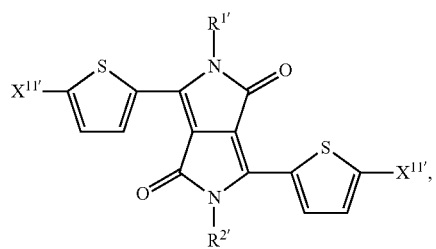
(IIa)
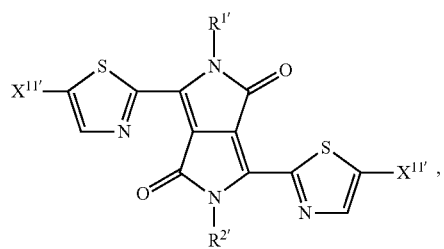
(IIb)
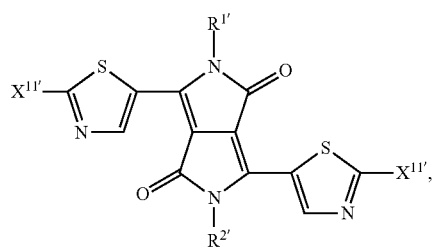
(IIc)
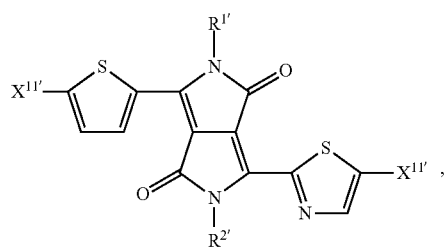
(IId)
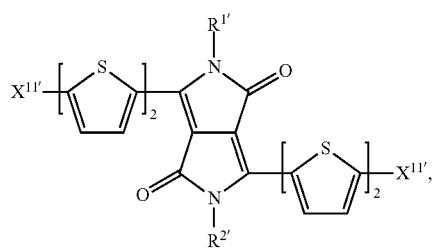
(IIe)
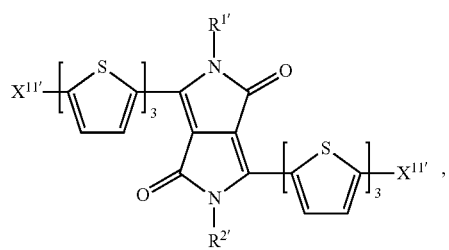
(IIf)
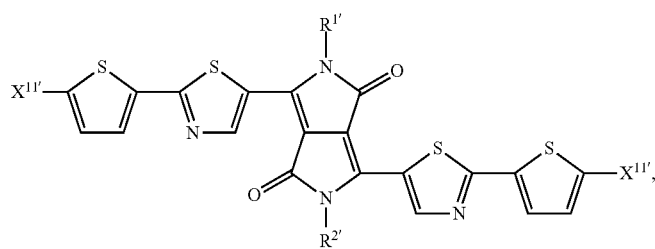
(IIg)
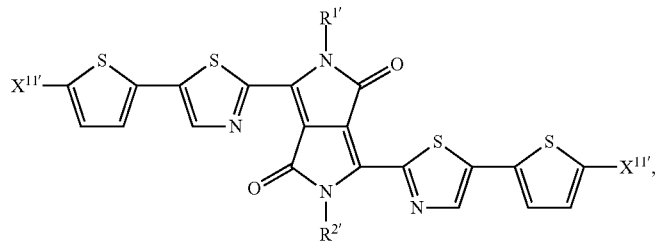
(IIh)
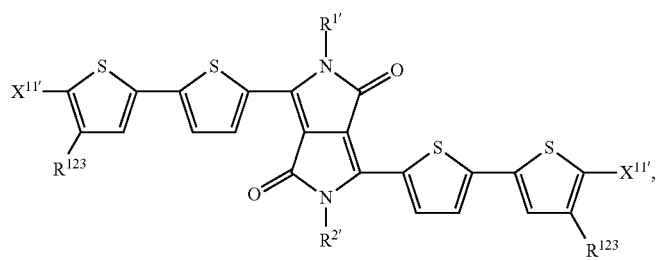
(IIi)

(IIj)
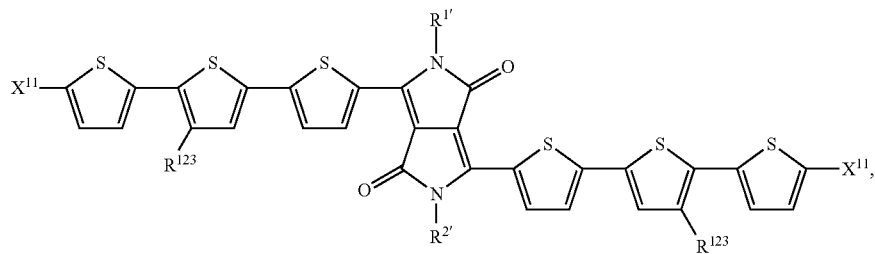
(IIk)
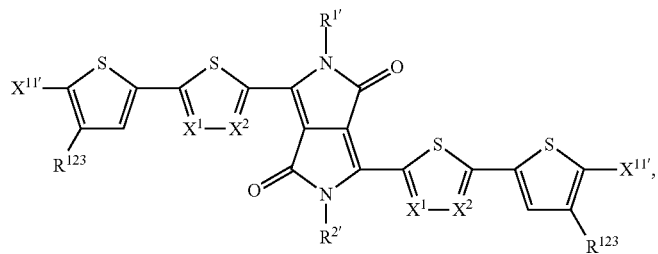
(IIl)
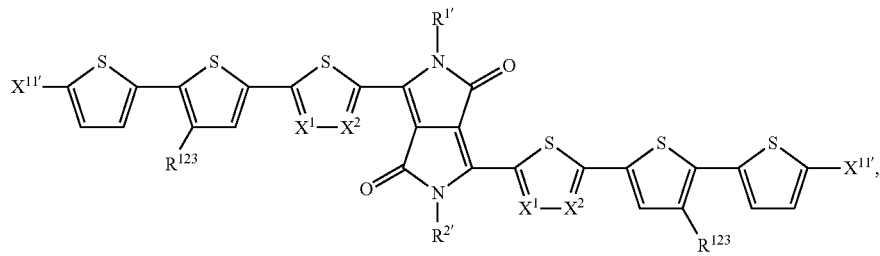
(IIm)
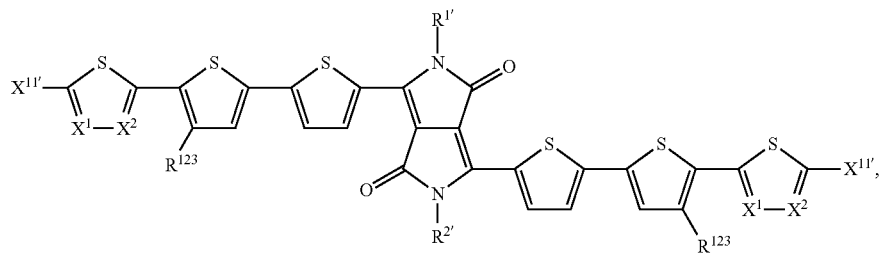
(IIn)
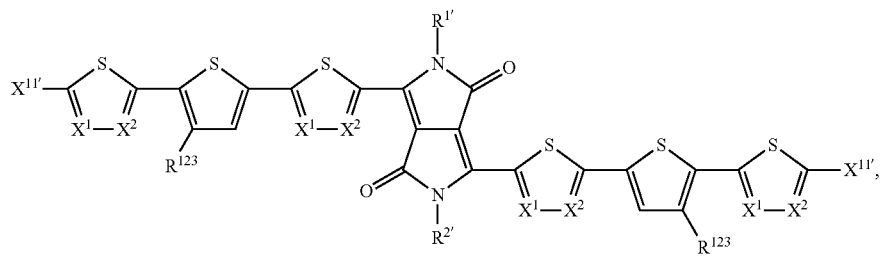
(IIo)
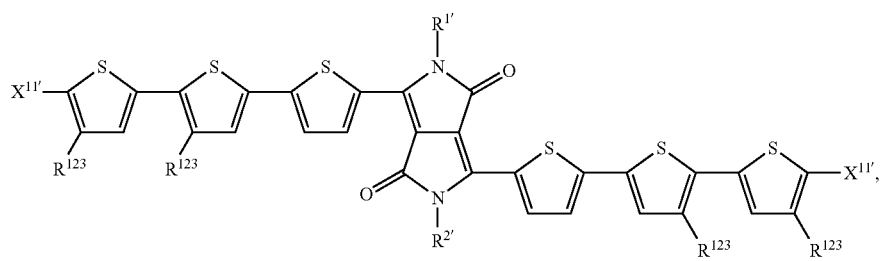

-continued

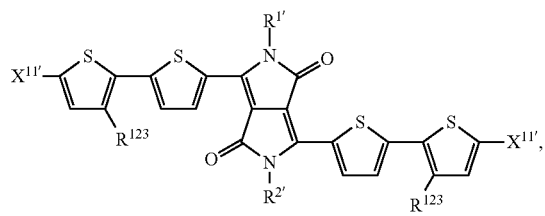 (IIp)

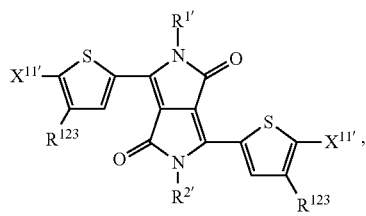 (IIq)

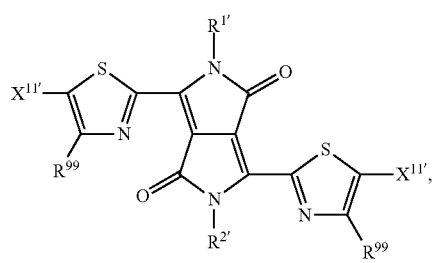 (IIr)

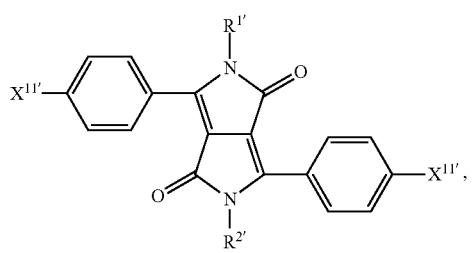 (IIs)

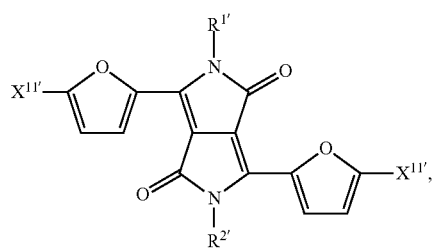 (IIt)

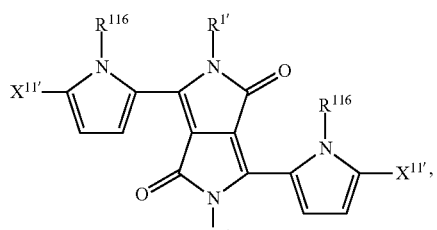 (IIu)

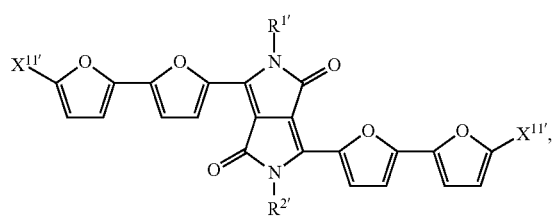 (IIv)

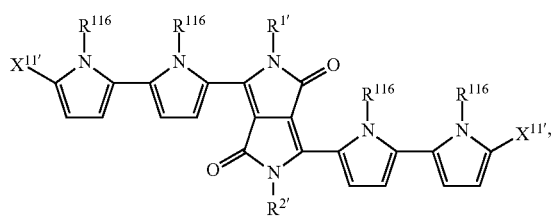 (IIw)

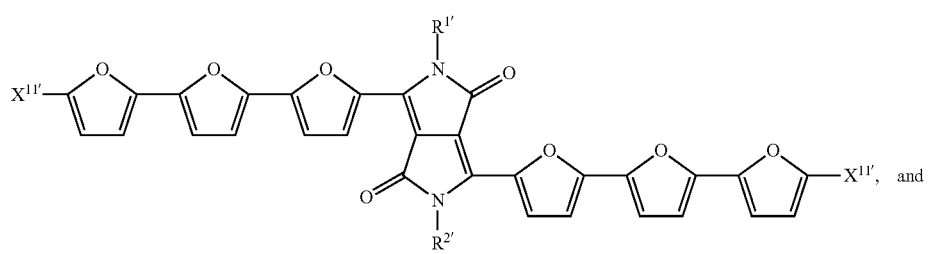 (IIx)

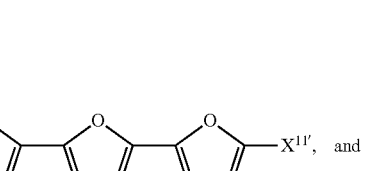 and

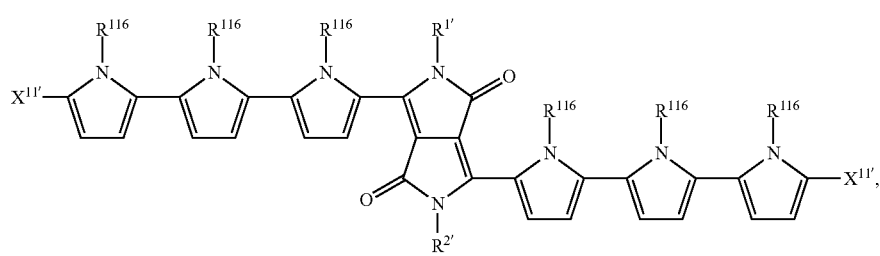

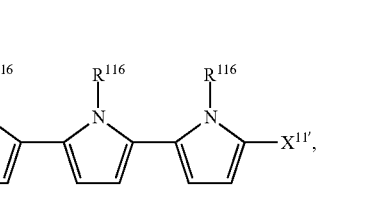 (IIy)

wherein:

R$^{1'}$ and R$^{2'}$ may be the same or different and are selected from the group consisting of hydrogen, a C$_1$-C$_{100}$alkyl group, —COOR$^{124'}$, a C$_1$-C$_{100}$alkyl group which is substituted by one or more halogen atoms, hydroxyl groups, nitro groups, —CN, or C$_6$-C$_{18}$ aryl groups and/or interrupted by —O—, —COO—, —OCO, or —S—, a C$_7$-C$_{100}$arylalkyl group, a carbamoyl group, a C$_5$-C$_{12}$cycloalkyl group which can be substituted one to three times with C$_1$-C$_8$alkyl, C$_1$-C$_8$alkoxy, or both, a C₆-C₂₄aryl group, a phenyl or 1- or 2-naphthyl group which can be substituted one to three times with C₁-C₈alkyl, C₁-C₂₄thioalkoxy, and/or C₁-C₂₄alkoxy, pentafluorophenyl;

$R^{124'}$ is a hydrogen or a $C_1$-$C_{50}$alkyl group;

$R^{123}$ is a $C_1$-$C_{25}$alkyl group optionally interrupted by one or more oxygen atoms, or a $C_1$-$C_{25}$alkoxy group;

$R^{99}$ is a $C_1$-$C_{25}$alkyl group optionally interrupted by one or more oxygen atoms;

one of $X^1$ and $X^2$ is N and the other is CH;

$R^{116}$ is H, $C_1$-$C_{25}$alkyl, or a phenyl optionally substituted one to three times with $C_1$-$C_8$alkyl, $C_1$-$C_{24}$alkoxy, or both;

$X^{11}$ is independently in each occurrence —B(OH)₂, —B(OY¹)₂, —B(OH)₃⁻, —BF₃⁻,

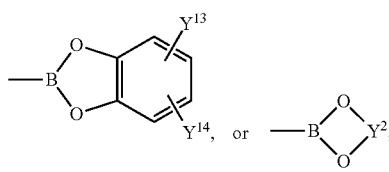

wherein Y¹ is independently in each occurrence a $C_1$-$C_{10}$alkyl group and Y² is independently in each occurrence a $C_2$-$C_{10}$alkylene group, and Y¹³ and Y¹⁴ are independently of each other hydrogen, or a $C_1$-$C_{10}$alkyl group; and $X^{11'}$ is a halogen.

11. The process of claim 1, wherein the at least one (hetero) aromatic compound is selected from the group consisting of (IIIa)
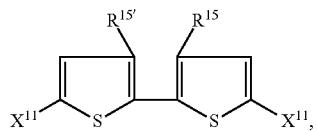

(IIIb)
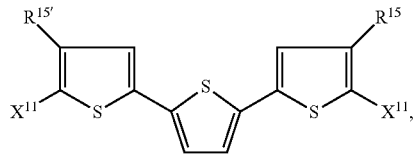

(IIIc)
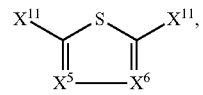

(IIId)
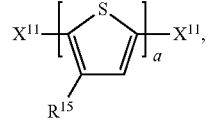

(IIIe)
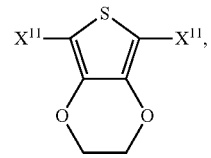

(IIIf)
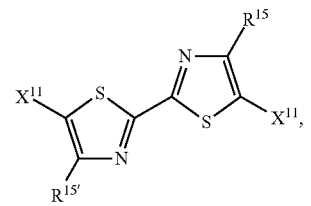

(IIIh)
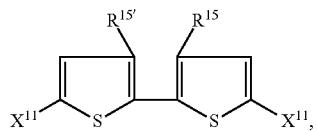

(IIIi)
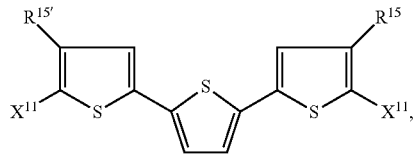

(IIIj)
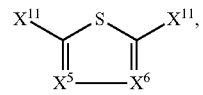

(IIIk)
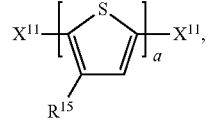

(IIIl)
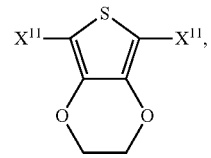

(IIIm)
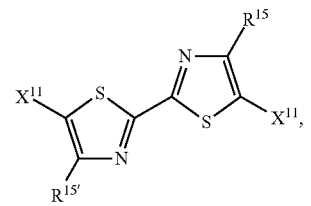

(IIIn)
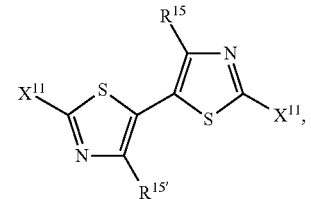

(IIIo)
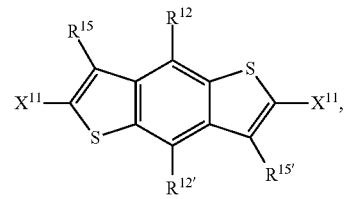

(IIIp)
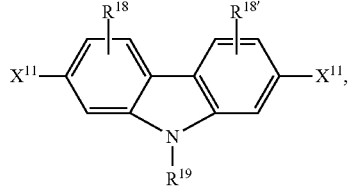

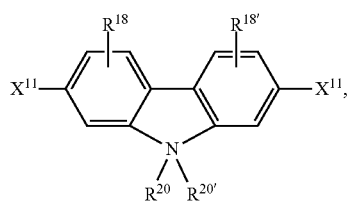 (IIIq)
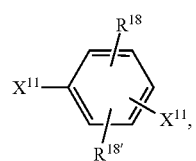 (IIIr)
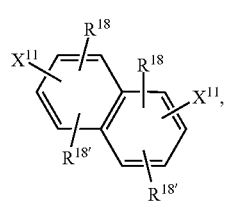 (IIIs)
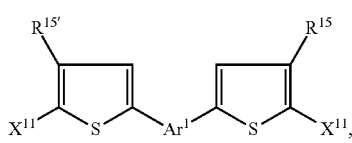 (IIIt)
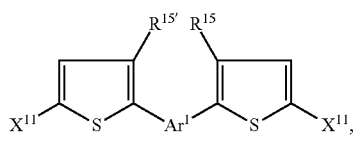 (IIIu)
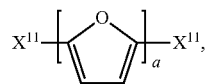 (IIIv)
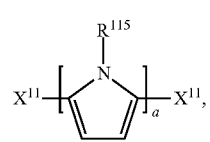 (IIIw)
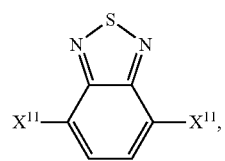 (IIIx)
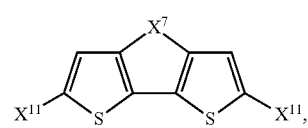 (IIIy)
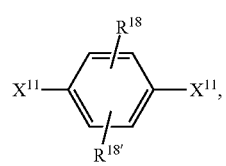 (IIIz)
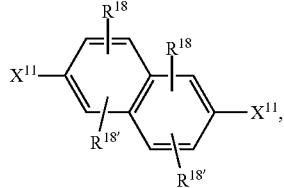 (IIIa')
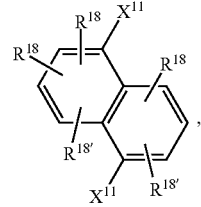 (IIIb')
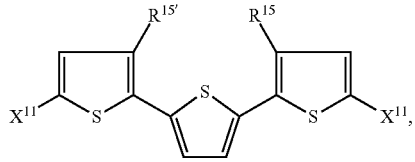 (IIIc')
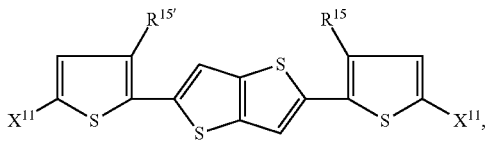 (IIId')
 (IVa)
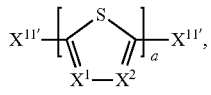 (IVb)
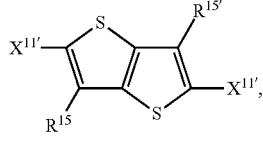 (IVc)
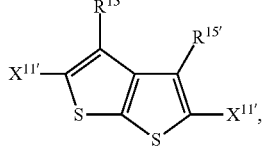 (IVd)
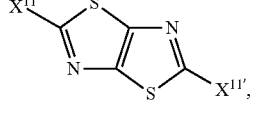 (IVe)
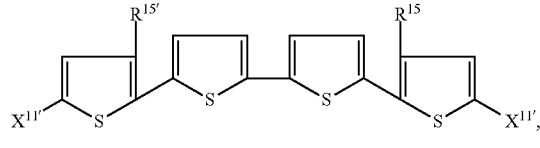 (IVf)

-continued
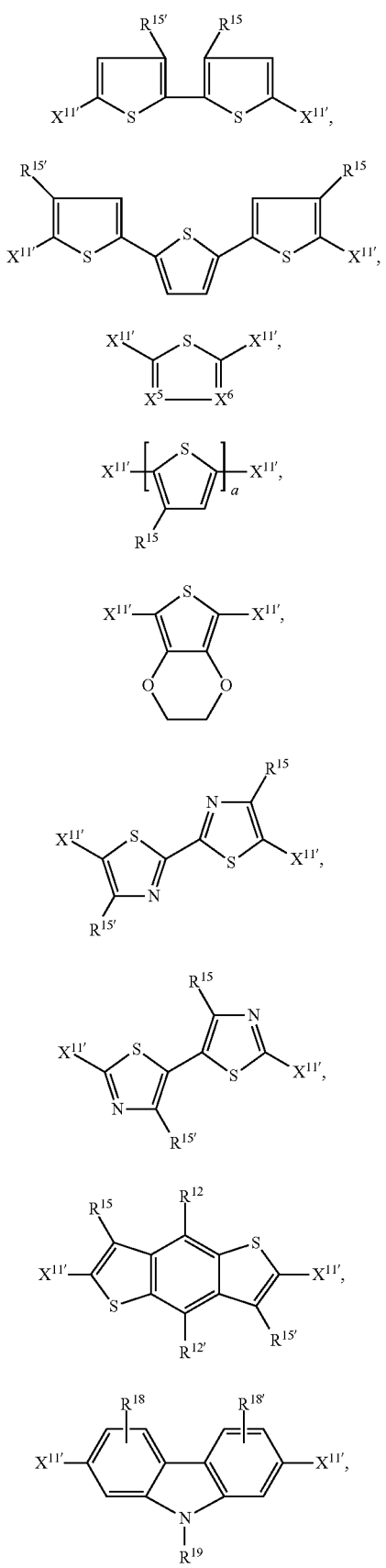
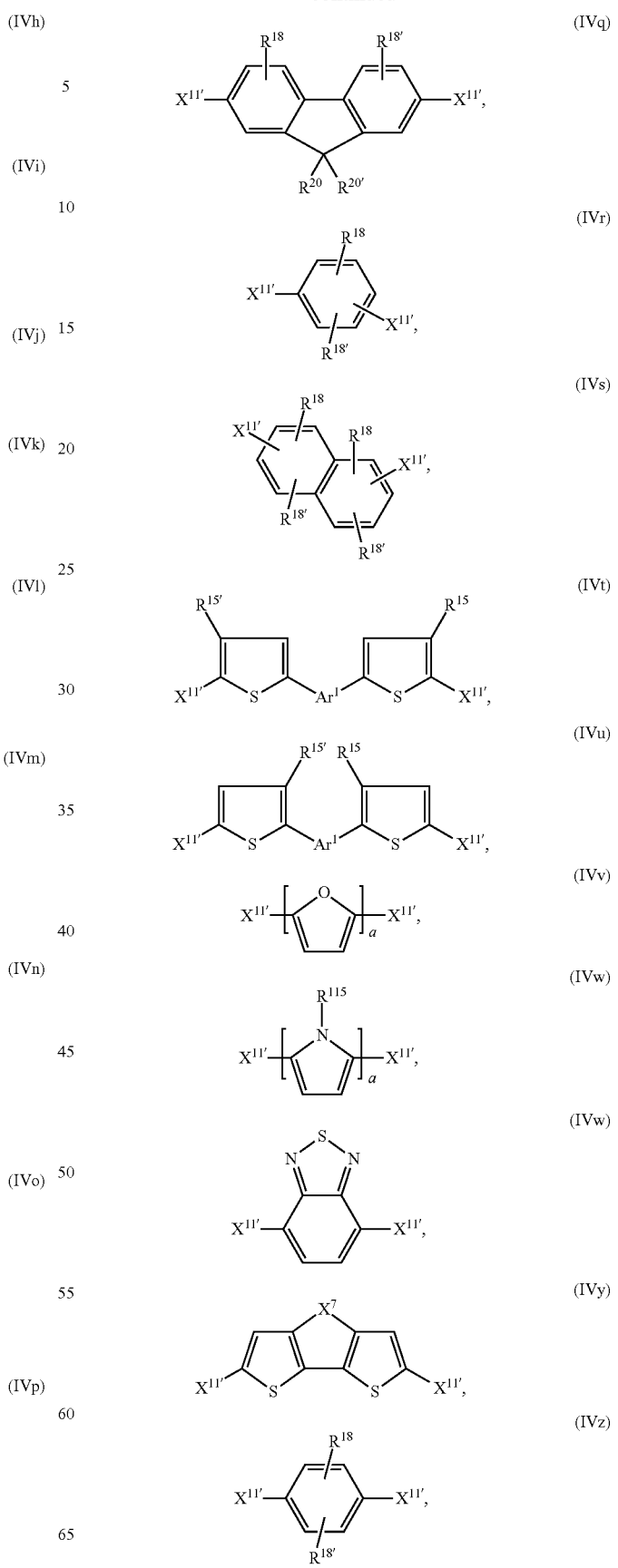

-continued

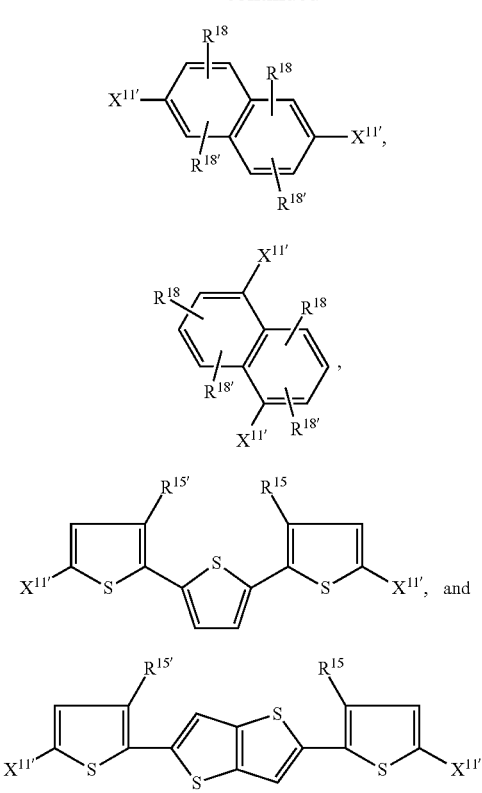

(Iva')

(Iva')

(IVc')

(IVd')

wherein:
$X^7$ is —O—, —S—, —NR$^{115}$—, or —Si(R$^{117}$)$_2$—;
a is an integer of 1 to 5;
one of $X^1$ and $X^2$ is N and the other is CH;
one of $X^5$ and $X^6$ is N and the other is CR$^{14}$;
$Ar^1$ is

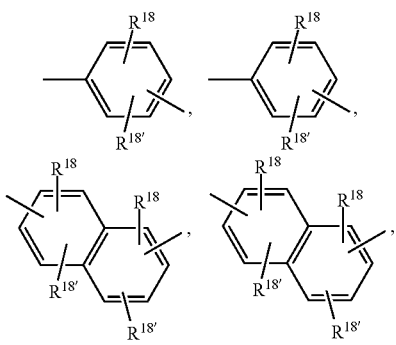

or a heteroarylene group;
$R^{115}$ is H, $C_1$-$C_{25}$alkyl, or phenyl optionally substituted one to three times with $C_1$-$C_8$alkyl, $C_1$-$C_{24}$alkoxy, or both;
$R^{117}$ is $C_1$-$C_{25}$alkyl;

$R^{12}$ and $R^{12'}$ are independently of each other hydrogen, halogen, $C_1$-$C_{25}$alkyl, optionally interrupted by one or more oxygen or sulphur atoms, $C_1$-$C_{25}$alkoxy, $C_7$-$C_{25}$arylalkyl, or

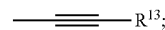

$R^{13}$ is a $C_1$-$C_{10}$alkyl group or a tri($C_1$-$C_8$alkyl)silyl group;
$R^{15}$ and $R^{15'}$ are independently of each other H, or a $C_1$-$C_{25}$alkyl group optionally interrupted by one or more oxygen atoms;
$R^{14}$ is a $C_1$-$C_{25}$alkyl group optionally interrupted by one or more oxygen atoms, or a $C_1$-$C_{25}$alkoxy group;
$R^{18}$ and $R^{18'}$ independently of each other are a hydrogen, halogen, $C_1$-$C_{25}$alkyl optionally interrupted by one or more oxygen or sulphur atoms, $C_7$-$C_{25}$aralkyl, or $C_1$-$C_{25}$alkoxy;
$R^{19}$ is hydrogen, $C_7$-$C_{25}$aralkyl, $C_6$-$C_{18}$aryl, $C_6$-$C_{18}$aryl substituted by a $C_1$-$C_{18}$alkyl, $C_1$-$C_{18}$alkoxy, or $C_1$-$C_{25}$alkyl optionally interrupted by one or more oxygen or sulphur atoms;
$R^{20}$ and $R^{20'}$ are independently of each other a hydrogen, $C_7$-$C_{25}$aralkyl, $C_1$-$C_{25}$alkyl, optionally interrupted by one or more oxygen or sulphur atoms;
$X^{11}$ is independently in each occurrence —B(OH)$_2$, —B(OY$^1$)$_2$, —B(OH)$_3^-$, —BF$_3^-$,

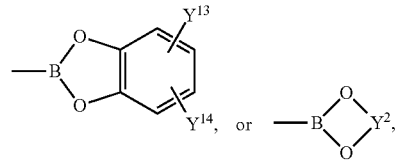

—BF$_4$Na, or —BF$_4$K, wherein $Y^1$ is independently in each occurrence a $C_1$-$C_{10}$alkyl group and $Y^2$ is independently in each occurrence a $C_2$-$C_{10}$alkylene group, or a $C_1$-$C_{10}$alkyl group, and $Y^{13}$ and $Y^{14}$ are independently of each other hydrogen or a $C_1$-$C_{10}$alkyl group; and
$X^{11'}$ is a halogen.

12. The process of claim 10, wherein $R^{124'}$ is a $C_8$-$C_{36}$alkyl group.

13. The process of claim 10, wherein $R^{123}$ is a $C_6$-$C_{25}$alkyl optionally interrupted by one or more oxygen atoms.

14. The process of claim 10, wherein $R^{99}$ is a $C_6$-$C_{25}$alkyl group optionally interrupted by one or more oxygen atoms.

15. The process of claim 11, wherein:
$Y^2$ is a —C$Y^3Y^4$—C$Y^5Y^6$—, or —C$Y^7Y^8$—C$Y^9Y^{10}$—C$Y^{11}Y^{12}$—, wherein $Y^3, Y^4, Y^5, Y^6, Y^7, Y^8, Y^9, Y^{10}, Y^{11}$ and $Y^{12}$ are hydrogen, or $Y^2$ is —C(CH$_3$)$_2$C(CH$_3$)$_2$—, —C(CH$_3$)$_2$CH$_2$C(CH$_3$)$_2$—, or —CH$_2$C(CH$_3$)$_2$CH$_2$—.

16. The process of claim 1, wherein two radicals $R_1$ are linked to one another with P to form a 5H-dibenzo-phospholyl, 9-phosphabicyclo[3.3.1]nonanyl, or 9-phospha-bicyclo[4.2.1]nonanyl.

* * * * *